US010361683B2

(12) United States Patent
Kanzaki

(10) Patent No.: US 10,361,683 B2
(45) **Date of Patent: *Jul. 23, 2019**

(54) SEMICONDUCTOR INTEGRATED CIRCUIT

(71) Applicant: Renesas Electronics Corporation, Tokyo (JP)

(72) Inventor: Teruaki Kanzaki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/004,478

(22) Filed: Jun. 11, 2018

(65) Prior Publication Data

US 2018/0294800 A1 Oct. 11, 2018

Related U.S. Application Data

(63) Continuation of application No. 15/473,813, filed on Mar. 30, 2017, now Pat. No. 10,020,799.

(30) Foreign Application Priority Data

May 9, 2016 (JP) ................................ 2016-093696

(51) Int. Cl.
*G06F 1/06* (2006.01)
*H03K 21/02* (2006.01)
(Continued)

(52) U.S. Cl.
CPC ............... *H03K 3/012* (2013.01); *G05F 1/56* (2013.01); *G11C 8/10* (2013.01); *H03K 21/026* (2013.01); *H03K 2005/00078* (2013.01)

(58) Field of Classification Search
CPC combination set(s) only.
See application file for complete search history.

(56) References Cited

U.S. PATENT DOCUMENTS

| | | | |
|---|---|---|---|
| 5,684,434 | A | 11/1997 | Mann et al. |
| 6,037,813 | A | 3/2000 | Eto et al. |

(Continued)

FOREIGN PATENT DOCUMENTS

| | | |
|---|---|---|
| JP | S49-25060 B1 | 6/1974 |
| JP | 57-111714 A | 7/1982 |

(Continued)

OTHER PUBLICATIONS

Notice of Reasons for Refusal issued in corresponding Japanese Patent Application No. 2016-093696, dated May 21, 2019, with English translation.

*Primary Examiner* — An T Luu
(74) *Attorney, Agent, or Firm* — McDermott Will & Emery LLP

(57) ABSTRACT

An object of the present invention is to reduce burden on a program for changing an operation mode of an internal circuit in accordance with an internal clock frequency without mounting a large-scale circuit in an LSI in which setting of the frequency of an internal clock can be dynamically changed. In an LSI including an internal clock generation circuit generating an internal clock from a clock source in accordance with a parameter supplied, a register storing frequency information of the clock source, a register storing the parameter, and an internal circuit having a plurality of operation modes, a table circuit controlling the operation mode of the internal circuit in association with the frequency information and the parameter supplied from the registers is provided.

8 Claims, 15 Drawing Sheets

(51) Int. Cl.

| | |
|---|---|
| ***H03K 3/012*** | (2006.01) |
| ***G05F 1/56*** | (2006.01) |
| ***G11C 8/10*** | (2006.01) |
| *H03K 5/00* | (2006.01) |

(56) References Cited

U.S. PATENT DOCUMENTS

| | | | |
|---|---|---|---|
| 6,442,703 | B1 | 8/2002 | Nakamura |
| 7,023,284 | B2 | 4/2006 | Sogawa et al. |
| 7,298,178 | B1 | 11/2007 | Sun et al. |

FOREIGN PATENT DOCUMENTS

| | | | |
|---|---|---|---|
| JP | 58-171842 | A | 10/1983 |
| JP | 10-209284 | A | 8/1998 |
| JP | 2015-201186 | A | 11/2015 |

FIG. 4

| DECODE No | DECODE INPUT | | | | | | | | DECODE OUTPUT | REFERENCE TABLE 34 (STORAGE VALUE OF L1 TO L27 AND OUTPUT VALUE 32) | STATE |
|---|---|---|---|---|---|---|---|---|---|---|---|
| | 30a[2] | 30a[1:0] | 4c | 5c | 6c | 7c | 8c | 9c[1:0] | | | |
| | 0: INITIAL VALUE SETTING<br>1: OPERATION | 0: 4MHz < OSCILLATOR ≦ 5MHz<br>1: 5MHz < OSCILLATOR ≦ 6MHz<br>2: 6MHz < OSCILLATOR ≦ 7MHz<br>3: 7MHz < OSCILLATOR ≦ 8MHz | 0: CLOCK STOP<br>1: CLOCK SUPPLY | | 0: OSCILLATION STOP<br>1: OSCILLATION | 0: PLL STOP OUTPUT = INPUT<br>1: PLL OPERATION OUTPUT = INPUT *10 MULTIPLICATION | 0: SELECT INTERNAL OSCILLATOR<br>1: SELECT PLL | 0: SELECT 1/4 FREQUENCY DIVISION<br>1: SELECT 1/2 FREQUENCY DIVISION<br>2: NO FREQUENCY DIVISION | | | |
| 1 | 0 | * | * | * | * | * | * | * | D1=1 | 00b | |
| 2 | 1 | * | * | * | * | * | 0 | * | D2=1 | 11b | CLOCK 19=0.25/0.5/1MHz |
| 3 | 1 | * | * | * | 0 | * | 1 | * | D3=1 | 00b | SETTING INHIBITED |
| 4 | 1 | 0 | * | * | 1 | 0 | 1 | 0 | D4=1 | 11b | CLOCK 19=max1.25MHz |
| 5 | 1 | 0 | * | * | 1 | 0 | 1 | 1 | D5=1 | 10b | CLOCK 19=max2.5MHz |
| 6 | 1 | 0 | * | * | 1 | 0 | 1 | 2 | D6=1 | 00b | CLOCK 19=max5MHz |
| 7 | 1 | 0 | * | * | 1 | 1 | 1 | 0 | D7=1 | 10b | CLOCK 19=max12.5MHz |
| 8 | 1 | 0 | * | * | 1 | 1 | 1 | 1 | D8=1 | 10b | CLOCK 19=max25MHz |
| 9 | 1 | 0 | * | * | 1 | 1 | 1 | 2 | D9=1 | 00b | CLOCK 19=max50MHz |
| 10 | 1 | 1 | * | * | 1 | 0 | 1 | 0 | D10=1 | 11b | CLOCK 19=max1.5MHz |
| 11 | 1 | 1 | * | * | 1 | 0 | 1 | 1 | D11=1 | 10b | CLOCK 19=max3MHz |
| 12 | 1 | 1 | * | * | 1 | 0 | 1 | 2 | D12=1 | 10b | CLOCK 19=max6MHz |
| 13 | 1 | 1 | * | * | 1 | 1 | 1 | 0 | D13=1 | 10b | CLOCK 19=max15MHz |
| 14 | 1 | 1 | * | * | 1 | 1 | 1 | 1 | D14=1 | 10b | CLOCK 19=max30MHz |
| 15 | 1 | 1 | * | * | 1 | 1 | 1 | 2 | D15=1 | 00b | CLOCK 19=max60MHz |
| 16 | 1 | 2 | * | * | 1 | 0 | 1 | 0 | D16=1 | 11b | CLOCK 19=max1.75MHz |
| 17 | 1 | 2 | * | * | 1 | 0 | 1 | 1 | D17=1 | 10b | CLOCK 19=max3.5MHz |
| 18 | 1 | 2 | * | * | 1 | 0 | 1 | 2 | D18=1 | 10b | CLOCK 19=max7MHz |
| 19 | 1 | 2 | * | * | * | 1 | 1 | 0 | D19=1 | 10b | CLOCK 19=max17.5MHz |
| 20 | 1 | 2 | * | * | * | 1 | 1 | 1 | D20=1 | 10b | CLOCK 19=max35MHz |
| 21 | 1 | 2 | * | * | * | 1 | 1 | 2 | D21=1 | 00b | CLOCK 19=max70MHz |
| 22 | 1 | 3 | * | * | * | 0 | 1 | 0 | D22=1 | 11b | CLOCK 19=max2MHz |
| 23 | 1 | 3 | * | * | * | 0 | 1 | 1 | D23=1 | 10b | CLOCK 19=max4MHz |
| 24 | 1 | 3 | * | * | * | 0 | 1 | 2 | D24=1 | 10b | CLOCK 19=max8MHz |
| 25 | 1 | 3 | * | * | * | 1 | 1 | 0 | D25=1 | 11b | CLOCK 19=max20MHz |
| 26 | 1 | 3 | * | * | * | 1 | 1 | 1 | D26=1 | 10b | CLOCK 19=max40MHz |
| 27 | 1 | 3 | * | * | * | 1 | 1 | 2 | D27=1 | 00b | CLOCK 19=max80MHz |

*: ANY OF 0 AND 1

FIG. 7

| DECODE No | DECODE INPUT | | | | | | | DECODE OUTPUT | REFERENCE TABLE 34 (STORAGE VALUE OF L1 TO L27 AND OUTPUT VALUE 32) | STATE |
|---|---|---|---|---|---|---|---|---|---|---|
| | 30a[0] | 4c | 5c | 6c | 7c | 8c | 9c[1:0] | | | |
| | 0: INITIAL VALUE SETTING<br>1: OPERATION | 0: CLOCK STOP<br>1: CLOCK SUPPLY | | 0: OSCILLATION STOP<br>1: OSCILLATION | 0: PLL STOP OUTPUT = INPUT<br>1: PLL OPERATION OUTPUT = INPUT * 10 MULTIPLICATION | 0: SELECT INTERNAL OSCILLATOR<br>1: SELECT PLL | 0: SELECT 1/4 FREQUENCY DIVISION<br>1: SELECT 1/2 FREQUENCY DIVISION<br>2: NO FREQUENCY DIVISION | | | |
| 1 | 0 | * | * | * | * | * | * | D1=1 | 00b | |
| 2 | 1 | * | * | * | * | 0 | * | D2=1 | 11b | CLOCK 19=0.25/0.5/1MHz |
| 3 | 1 | * | * | 0 | * | 1 | * | D3=1 | 00b | SETTING INHIBITED |
| 4 | 1 | * | * | 1 | 0 | 1 | 0 | D4=1 | 11b | CLOCK 19=1.5MHz |
| 5 | 1 | * | * | 1 | 0 | 1 | 1 | D5=1 | 10b | CLOCK 19=3MHz |
| 6 | 1 | * | * | 1 | 0 | 1 | 2 | D6=1 | 10b | CLOCK 19=6MHz |
| 7 | 1 | * | * | 1 | 1 | 1 | 0 | D7=1 | 10b | CLOCK 19=15MHz |
| 8 | 1 | * | * | 1 | 1 | 1 | 1 | D8=1 | 10b | CLOCK 19=30MHz |
| 9 | 1 | * | * | 1 | 1 | 1 | 2 | D9=1 | 00b | CLOCK 19=60MHz |

*: ANY OF 0 AND 1

FIG. 13

| DECODE No | DECODE INPUT | | | | | | | DECODE OUTPUT | REFERENCE TABLE 34 (STORAGE VALUE OF L1 TO L27 AND OUTPUT VALUE 32) | STATE |
|---|---|---|---|---|---|---|---|---|---|---|
| | 30a[0] | 4c | 5c | 6c | 7c | 8c | 9c[1:0] | | | |
| | 0: INITIAL VALUE SETTING<br>1: OPERATION | 0: CLOCK STOP<br>1: CLOCK SUPPLY | | 0: OSCILLATION STOP<br>1: OSCILLATION | 0: PLL STOP OUTPUT = INPUT<br>1: PLL OPERATION OUTPUT = INPUT * 10 MULTIPLICATION | 0: SELECT INTERNAL OSCILLATOR<br>1: SELECT PLL | 0: SELECT 1/4 FREQUENCY DIVISION<br>1: SELECT 1/2 FREQUENCY DIVISION<br>2: NO FREQUENCY DIVISION | | | |
| 1 | 0 | * | * | * | * | * | * | D1=1 | 0000b | |
| 2 | 1 | * | * | 0 | 0 | 0 | * | D2=1 | 0011b | CLOCK 19=0.25/0.5/1MHz |
| 3 | 1 | * | * | 0 | 1 | 0 | * | D3=1 | 0111b | CLOCK 19=0.25/0.5/1MHz |
| 4 | 1 | * | * | 1 | 0 | 0 | * | D4=1 | 0111b | CLOCK 19=0.25/0.5/1MHz |
| 5 | 1 | * | * | 0 | * | 1 | * | D5=1 | 1000b | SETTING INHIBITED |
| 6 | 1 | * | * | 1 | 0 | 1 | 0 | D6=1 | 0011b | CLOCK 19=1.5MHz |
| 7 | 1 | * | * | 1 | 0 | 1 | 1 | D7=1 | 0010b | CLOCK 19=3MHz |
| 8 | 1 | * | * | 1 | 0 | 1 | 2 | D8=1 | 0010b | CLOCK 19=6MHz |
| 9 | 1 | * | * | 1 | 1 | 1 | 0 | D9=1 | 0010b | CLOCK 19=15MHz |
| 10 | 1 | * | * | 1 | 1 | 1 | 1 | D10=1 | 0010b | CLOCK 19=30MHz |
| 11 | 1 | * | * | 1 | 1 | 1 | 2 | D11=1 | 0000b | CLOCK 19=60MHz |

*: ANY OF 0 AND 1

SEMICONDUCTOR INTEGRATED CIRCUIT

CROSS-REFERENCE TO RELATED APPLICATIONS

This Application is a Continuation of U.S. application Ser. No. 15/473,813, filed Mar. 30, 2017, claiming priority based on Japanese Patent Application No. 2016-093696 filed on May 9, 2016, the contents of all of which are incorporated herein by reference in their entirety.

BACKGROUND

The present invention relates to a semiconductor integrated circuit and, particularly, can be suitably used for a semiconductor integrated circuit in which operation frequency can be adjusted by register setting and an operation mode can be also changed.

In a semiconductor integrated circuit (LSI: Large Scale Integrated circuit) such as a microcomputer, there is a case that a high-speed process such as high-speed data computation has to be executed, and there is also a case that a high-speed process is unnecessary, for example, in a standby state such as an external interrupt. Consequently, a usage mode of using a high-speed clock in the case of executing a high-speed process by a program and switching it to a low-speed clock by the program in the standby state for the purpose of lowering power consumption is common.

Consequently, hardware of a microcomputer is configured so that the frequency of the operation clock can be properly changed by a method of internally generating clocks of a plurality of kinds of frequencies and switching the operation clocks. For example, a high-speed clock is generated by using a PLL (Phase Locked Loop) for a clock generated by an oscillator which is mounted internally or externally and, by dividing the frequency of the clock, a low-speed clock is generated. A low-speed clock generated by a plurality of oscillators such as a 32 kHz oscillator for clock is also generated. The microcomputer has a configuration that the operation clock frequency can be properly switched by a program.

As described above, the microcomputer has to be operated by clocks of various frequencies from the low-speed clock to the high-speed clock. When the current drive capability of a transistor of an internal circuit is adjusted so that the high-speed operation can be performed and the operation is performed with the capability also at a low-speed clock, the transistor has current drive capability which is more than necessary in the low-speed clock range, and the power efficiency deteriorates. To handle the problem and lower the power consumption, conventionally, for example, the following various measures have been taken.

(1) At a low-speed clock, the voltage of an internal step-down regulator is lowered to suppress power consumption.

(2) At a low-speed clock, the current supply capability of an internal step-down regulator is lowered or the number is reduced to reduce fixed current of the regulator.

(3) In an internal memory, at the time of operation at a high-speed clock, a sense amplifier is always operated for high-speed reading. At the time of operation at a low-speed clock, the sense amplifier is operated only when a read request is generated.

On the other hand, a technique of detecting the frequency (low/high) and the range of a clock signal supplied from the outside of a semiconductor integrated circuit, and changing a power supply voltage supplied to an internal circuit or changing the operation is proposed as follows.

In patent literature 1, an integrated circuit having a differentiation circuit, an integration circuit, and a comparator as circuit means detecting the frequency of an input clock signal is disclosed. An input clock signal is differentiated by the differentiation circuit and, after that, the resultant signal is processed in the integration circuit to output a voltage level depending on the frequency. The voltage level is compared with a predetermined level by the comparator. When a normal clock is input, the frequency is high, so that the output level of the integration circuit is high and exceeds the predetermined level. On the other hand, when a clock for a test is input, the frequency is low, so that the output level of the integration circuit is low and does not exceed the predetermined level. By switching the operation mode between a normal operation mode and a test mode in accordance with the output of the comparator, it becomes unnecessary to further provide a mode switching terminal, and the number of terminals does not increase.

In patent literature 2, an integrated circuit device having an operation voltage converting device capable of changing operation voltage supplied to a function circuit block in accordance with the operation speed of a system is disclosed. The operation voltage converting device has a frequency detection circuit detecting the frequency of an input clock, a low-voltage power supply circuit generating a plurality of operation voltages, and a power supply selection circuit selecting an operation voltage in accordance with the detected frequency.

In patent literature 3, a semiconductor device which can be adapted to any of high-speed operation and low-power-consumption operation by determining whether the operation is high-speed operation or low-speed operation on the basis of an input clock synchronization signal and switching an internal circuit is disclosed. The semiconductor device includes a clock generation circuit generating an internal clock having a predetermined phase relation for an input clock supplied, a determination circuit determining the cycle of the input clock on the basis of an internal signal of the clock generation circuit, and an internal circuit switching the operation mode in accordance with a determination result of the determination circuit.

RELATED ART LITERATURE

Patent Literature

Patent Literature 1: Japanese Unexamined Patent Application Publication No. Sho 57(1982)-111714

Patent Literature 2: Japanese Unexamined Patent Application Publication No. Sho 58(1983)-171842

Patent Literature 3: Japanese Unexamined Patent Application Publication No. Hei 10(1998)-209284

SUMMARY

In a semiconductor integrated circuit, particularly, in a general semiconductor integrated circuit such as a microcomputer, by register setting or the like, the operation frequency can be changed dynamically in a wide range. An internal circuit in such a semiconductor integrated circuit has various operation modes according to operation frequencies, which can be freely changed by register setting. Both register setting to specify the operation frequency and register setting to specify the operation mode of the internal circuit are performed in a program which is executed. However, since the operation mode of the internal circuit has to be properly changed in association with the change of the setting of the operation frequency, there is a problem that the burden on the program designer is heavy.

To properly set the operation mode of the internal circuit, the operation frequency at that time point has to be accurately grasped. It was, however, found that it is a heavy burden on the program designer to accurately always grasp the operation frequency at each time during execution of the program which changes due to occurrence of plural and multiple interruptions, occurrence of an exceptional process, and the like. Another problem was also found such that even when the internal circuit is set to the operation mode of high operation frequency in a period in which the operation frequency is low, the circuit operates normally from the viewpoint of the function so that deterioration in power efficiency cannot be easily detected. For example, when program verification is performed in a state where the power efficiency deteriorates at a program development stage and, after that, the problem of the deterioration in the power efficiency is found, in some cases, the program verification has to be made again after properly changing the operation mode setting.

To further reduce waste of consumption power of the semiconductor integrated circuit, there is a tendency that the operation mode of the internal circuit is more finely subdivided. Accordingly, there is a tendency that the burden on the program designer becomes heavier.

To handle the problem, by employing the techniques described in the patent literatures 1, 2, and 3, it is expected that the operation frequency is measured and, automatically (autonomously), the operation mode of the internal circuit can be properly changed. The inventors of the present invention consequently examined the patent literatures 1, 2, and 3 and found that there are the following new problems.

The technique described in the patent literature 1 relates to the circuit capable of discriminating the two operation modes (the normal mode and the test mode) by the input clock frequency (high/low). Since the frequency as a threshold is specified by the circuit constant of the differentiation circuit and the integration circuit, the circuit scale for the determination is large. If the operation frequency is determined in multiple stages, the circuit scale further increases.

In the technique described in the patent literature 2, although the frequency range can be detected in multiple stages, since the device is comprised of the frequency detection circuit comprised mainly of a counter circuit, a constant voltage generation circuit generating multiple analog voltage levels, and a comparison circuit (voltage selection circuit), the circuit scale is large.

Also in the technique described in the patent literature 3, the clock generation circuit generating an internal clock having a predetermined phase relation with respect to an input clock which is supplied and the determination circuit have to be mounted.

To measure or determine the operation frequency, by any of the above techniques, the large-scale circuits have to be mounted, and it causes increase in the circuit scale.

Means for solving such a problem will be described below. The other problems and novel features will become apparent from the description of the specification and the appended drawings.

An embodiment is as follows.

In a semiconductor integrated circuit including an internal clock generation circuit generating an internal clock from a clock source in accordance with a parameter supplied, a register storing frequency information of the clock source, a register storing the parameter, and an internal circuit having a plurality of operation modes, a table circuit controlling the operation mode of the internal circuit is provided in association with the frequency information and the parameter supplied from the registers.

An effect obtained by the embodiment will be briefly described as follows.

That is, since the operation mode of the internal circuit is changed according to the frequency of the internal clock without mounting large-scale circuits such as the frequency measurement circuit and the frequency determination circuit, the burden on the program can be reduced.

BRIEF DESCRIPTION OF THE DRAWINGS

FIG. 4 is a truth table illustrating an example of functions of the table circuit.

FIG. 7 is a truth table illustrating an example of functions of the table circuit of FIG. 6.

FIG. 13 is a truth table illustrating an example of functions of the table circuit of the fourth embodiment.

DETAILED DESCRIPTION

Figure 1:
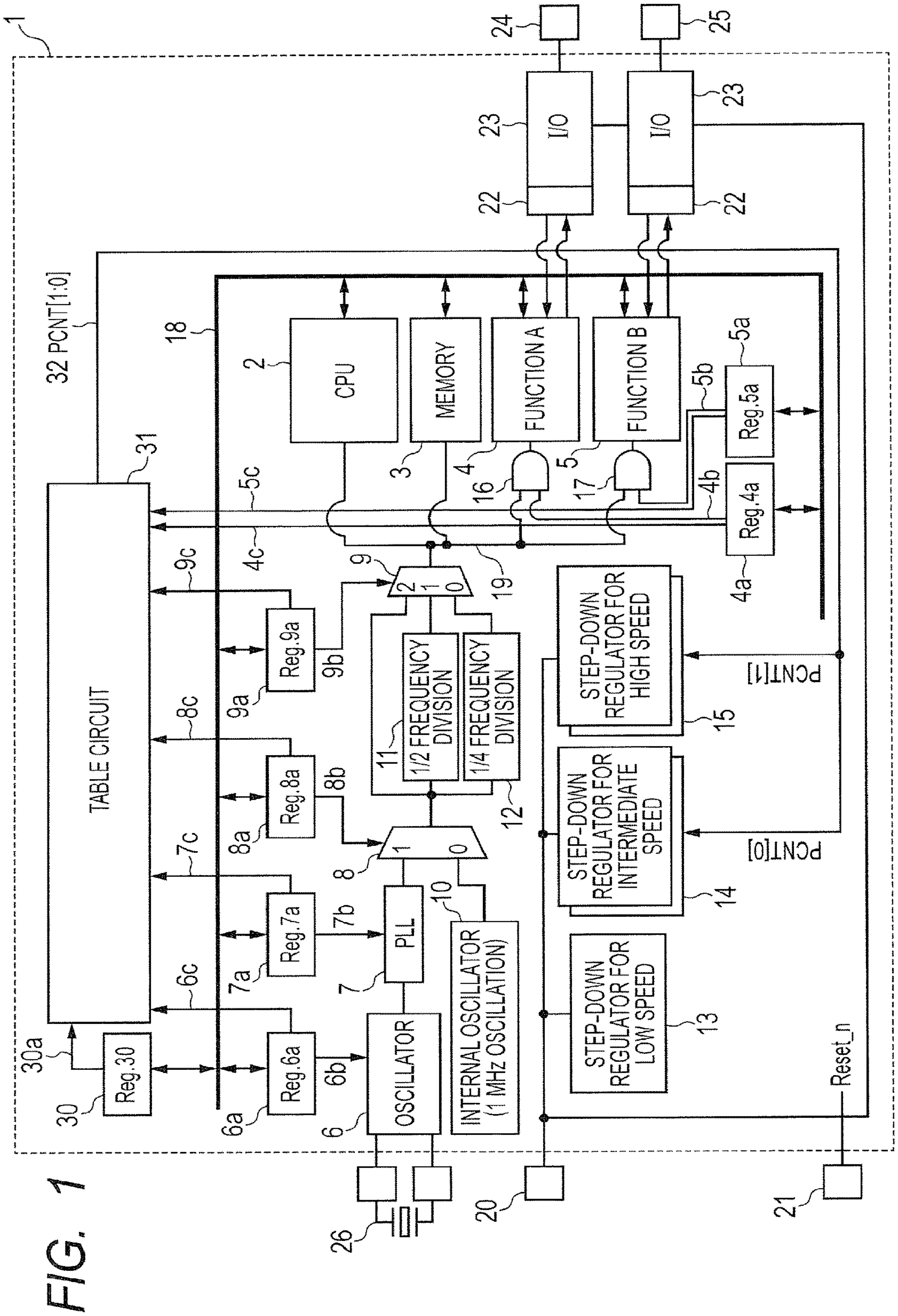
FIG. 1 is a block diagram illustrating a configuration example of a semiconductor integrated circuit of a first embodiment.

Embodiments will be described in detail. In all of the diagrams for explaining modes for carrying out the invention, the same reference numeral is designated to elements having the same function and its description will not be repeated.

Examination Example

Prior to description of modes for carrying out the present invention, the problems to be solved by the invention will be described by a more concrete examination example.

Figure 14:
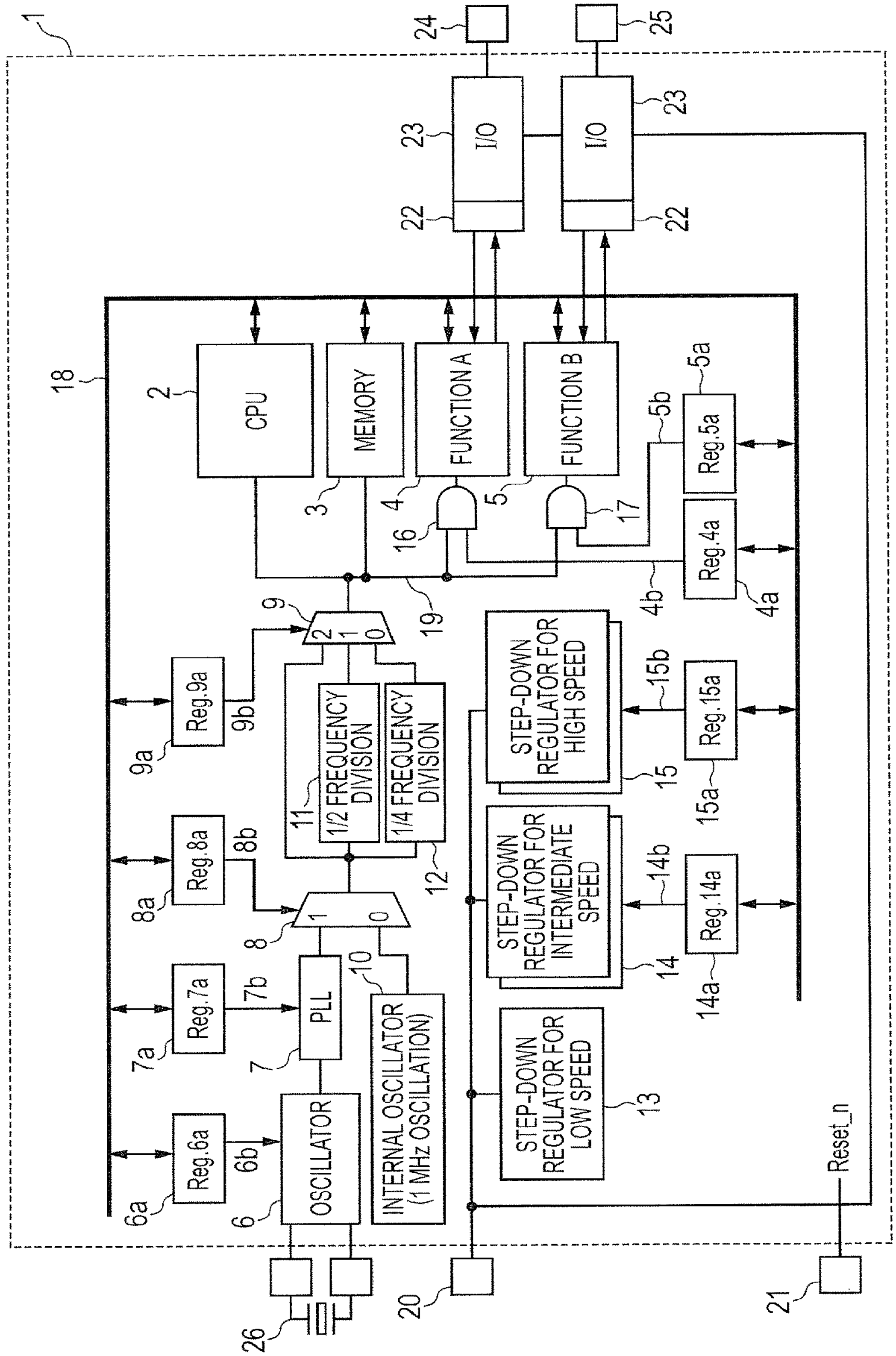
FIG. 14 is a block diagram illustrating a configuration example of a semiconductor integrated circuit for examining problems.

FIG. 14 is a block diagram illustrating a configuration example of a semiconductor integrated circuit 1 for examining problems, which is generated by the inventors of the present invention. The example corresponds to the technique described in (2) in "BACKGROUND", 1 denotes the semiconductor integrated circuit, and a microcomputer will be described as an example. Although wirings in the diagram are mounted by arbitrary number of signal lines, the number of the signal lines (whether it is singular or plural) is not specified, and so-called vector notation is omitted. Those are similar in the other drawings in the present application, and, in some cases, so-called vector notation is omitted.

Reference numeral 2 denotes a CPU (Central Processing Unit), 3 denotes a nonvolatile rewritable memory, and 4 and 5 denote function modules having arbitrary functions such as a timer (indicated as "function A" and "function B") which are coupled to one another via a bus 18. 6 denotes an oscillator, 7 denotes a PLL (Phase Locked Loop), 8 and 9 denote selectors, 10 indicates an internal oscillator, and 11 and 12 indicate frequency dividers dividing a clock to ½ and dividing a clock to ¼, respectively, which generally configure an internal clock generation circuit generating an internal clock 19. The layer of the "internal clock generation circuit" is not illustrated in the diagram.

The oscillator 6 to which an external oscillator 26 is coupled externally generates a clock source signal and generates a multiplication clock via the PLL 7. On the other hand, the internal oscillator 10 generates an internal clock source signal of, for example, 1 MHz. The selector 8 selects either the multiplication clock or the internal clock source signal generated by the internal oscillator 10 and, further, the selector 9 selects any of an output (without frequency division) of the selector 8, a clock obtained by dividing the frequency of the output of the selector 8 to ½ by the frequency divider 11, or a clock obtained by dividing the frequency of the output of the selector 8 to ¼ by the frequency divider 12, and outputs the selected output as the internal clock 19. The internal clock 19 is supplied to internal circuits such as the CPU 2, the memory 3, and the function modules 4 and 5.

6*a*, 7*a*, 8*a*, and 9*a* are registers capable of writing/reading data via the bus 18 when the CPU 2 executes a program stored in the memory 3. The registers 6*a*, 7*a*, 8*a*, and 9*a* supply a parameter to the internal clock generation circuit. On the basis of the parameter supplied, the internal clock generation circuit generates the internal clock signal 19 from a clock source such as a clock source signal or an internal clock source signal. For example, the oscillator 6 is controlled by a parameter 6*b* supplied from the register 6*a*, stopped by "0" and operated by "1". The PLL 7 is controlled by a parameter 7*b* supplied from the register 7*a*, stops operation by "0" and outputs the clock source signal without multiplying the signal, and performs multiplying operation by "1". The selector 8 is controlled by a parameter 8*b* supplied from the register 8*a*, selects the internal clock source signal of the internal oscillator (1 MHz) 10 by "0", and selects a multiplied clock output from the PLL 7 by "1". The selector 9 is controlled by a parameter 9*b* supplied from the register 9*a*, selects the frequency divider 12 (¼ frequency division) by "0", selects the frequency divider 11 (½ frequency division) by "1", and selects an output (without frequency division) of the selector 8 by "2".

21 denotes a reset terminal and, by a reset signal Reset_n, various internal circuits in the semiconductor integrated circuit 1 are initialized.

13 denotes a step-down regulator for low speed, 14 denotes a step-down regulator for intermediate speed, and 15 denotes a step-down regulator for high speed. The step-down regulators 13 to 15 decrease external power supplied from a power supply terminal 20 and supply internal power to the semiconductor integrated circuit 1. 14*a* and 15*a* denote registers to/from which data can be written/read via the bus 18 by executing the program stored in the memory 3 by the CPU 2, and which supply control signals 14*b* and 15*b* to the step-down regulator 14 for intermediate speed and the step-down regulator 15 for high speed, respectively. The step-down regulator 13 for low speed always operates. The step-down regulator 14 for intermediate speed is controlled by the control signal 14*b* supplied from the register 14*a*, and the step-down regulator 15 for high speed is controlled by the control signal 15*b* supplied from the register 15*a*. For example, the step-down regulator 14 for intermediate speed operates when the control signal 14*b* is "0" and stops when the control signal 14*b* is "1", and the step-down regulator 15 for high speed operates when the control signal 15*b* is "0" and stops when the control signal 15*b* is "1".

The regulators 13, 14, and 15 can supply the internal power of a current amount according to the operation frequency of the semiconductor integrated circuit 1 by a combination of the regulators. For example, at the time of high-speed operation, since consumption power is high and the current amount to be supplied to the internal power is also large, all of the regulators 13, 14, and 15 are operated. At the time of intermediate-speed operation, since consumption power is intermediate and the current amount to be supplied to the internal power is also intermediate, the step-down regulator 13 for low speed and the step-down regulator 14 for intermediate speed are operated but the step-down regulator 15 for high speed is stopped. At the time of low-speed operation, since the consumption power is the lowest and the current amount to be supplied to the internal power is also the lowest, only the step-down regulator 13 for low speed is operated, and the step-down regulator 14 for intermediate speed and the step-down regulator 15 for high speed are stopped. Since each of the regulators 13, 14, and 15 consumes fixed current in accordance with its current supply capability, by operating only the minimum number of the regulators and stopping the other regulators, consumption current of the semiconductor integrated circuit 1 due to the fixed current of the regulator can be reduced.

To each of the function modules 4 and 5, an I/O unit 23 is coupled via a level shifter 22. Via external terminals 24 and 25, signals are input/output from/to the outside. The level shifter 22 converts the voltage level between the internal power generated by the step-down regulators 13, 14, and 15 and the external power supplied from the power supply terminal 20 to help conversion of the signal to the I/O unit 23 operating on the external power. To the function modules 4 and 5, AND circuits 16 and 17 are coupled, and the internal clock signal 19 is gated and supplied. 4*a* and 5*a* denote registers to/from which data can be written/read via the bus 18 by executing the program stored in the memory 3 by the CPU 2 and which supply control signals 4*b* and 5*b* to the AND circuits 16 and 17, respectively. When the function module 4 is not used, the CPU 2 stops the operation of the function module 4 by writing control information of stopping supply of the internal clock signal 19 to the register 4*a*. Similar operation is performed also to the function module 5 and the register 5*a*.

Figure 15:
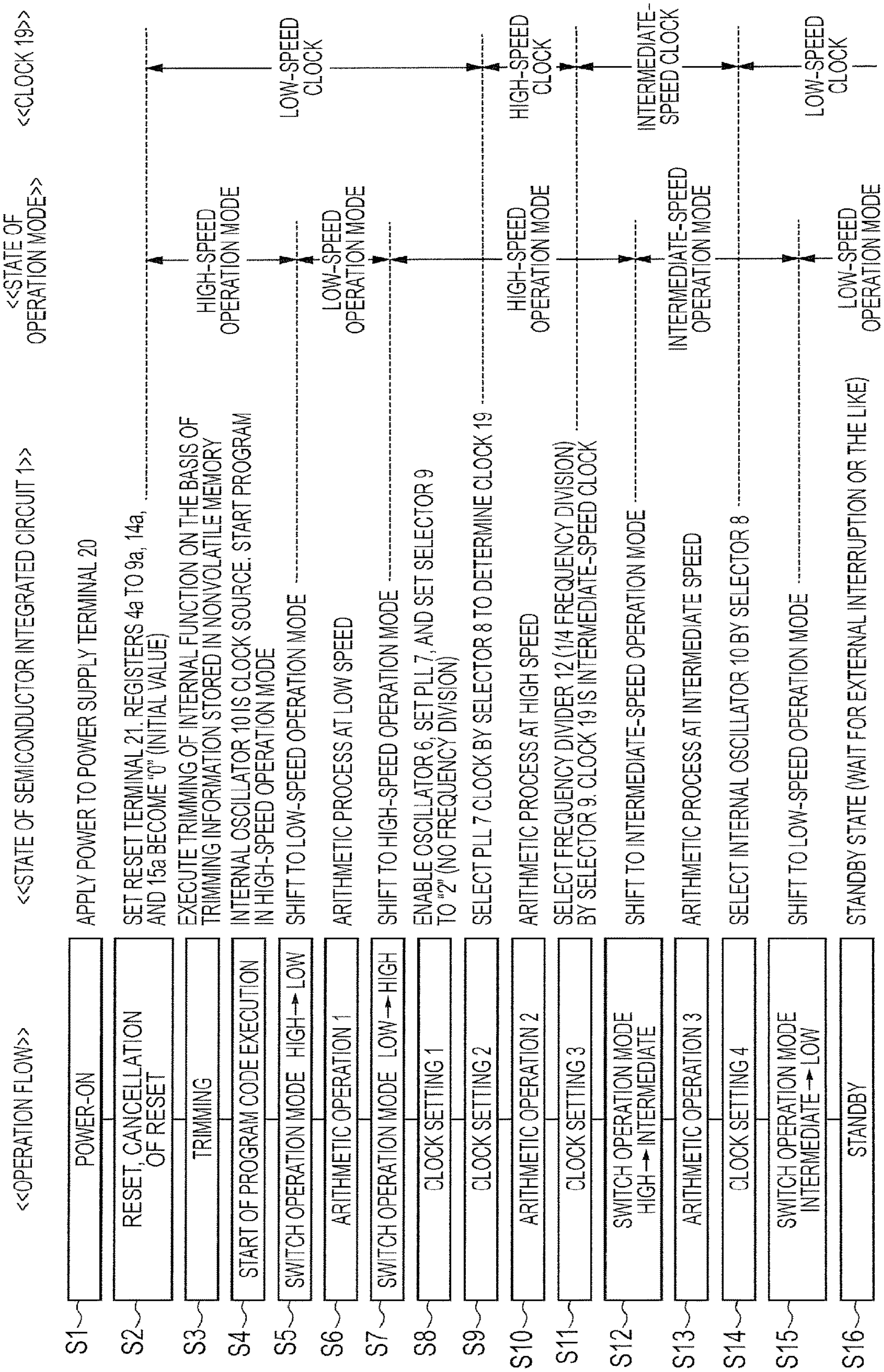
FIG. 15 is a flowchart illustrating an operation example of the semiconductor integrated circuit of FIG. 14.

FIG. 15 is a flowchart illustrating an operation example of the semiconductor integrated circuit 1 for examining the problems illustrated in FIG. 14. It relates to an example of the case where the semiconductor integrated circuit 1 has the following three operation modes in accordance with the current supply capabilities of the regulators 13 to 15 which shift.

In the high-speed operation mode, all of the regulators 13, 14, and 15 operate and high-speed arithmetic operation using a no-frequency-division path of the PLL 7 and the selector 9 can be executed.

In the intermediate-speed operation mode, the step-down regulator 15 for high speed stops, the step-down regulator 14 for intermediate speed and the step-down regulator 13 for low speed operate, and intermediate-speed arithmetic operation using a ¼-frequency-division path of the PLL 7 and the selector 9 can be executed.

In the low-speed operation mode, the step-down regulator 14 for intermediate speed and the step-down regulator 15 for high speed stop, only the step-down regulator 13 for low speed operates, and low-speed arithmetic operation using the internal oscillator 10 is executed, or the semiconductor integrated circuit 1 can be in a standby state.

The operation flow of FIG. 15 illustrates the operation of the low-power-consumption control in the case where, first, the low-speed arithmetic operation using the internal oscillator 10 is performed, the high-speed arithmetic operation using the no-frequency-division path of the PLL 7 and the selector 9 is performed, the intermediate-speed arithmetic operation using the ¼-frequency-division path of the PLL 7 and the selector 9 is performed and, finally, the operation shifts to a standby state using the internal oscillator 10.

The operation flow will be described.

In a power-on step (S1), power is applied to the power supply terminal 20.

In a reset and reset-cancellation step (S2), a reset signal is asserted from the reset terminal 21 and, after that, cancelled, and the semiconductor integrated circuit 1 starts operating. It is assumed that, in the reset, the registers 4*a* to 9*a*, 14*a*, and 15*a* are cleared to "0". That is, by the register output signals 4*b* to 9*b*, the clock 19 is sent via the selector 8, the frequency divider 12 (¼ frequency division), and the selector 9, and the internal oscillator (1 MHz) 6 is selected. A clock of the function module (function A) 4 is supplied to the AND circuit 16 via the signal 4*b* having the value "0" of the register 4*a*, and no clock is supplied. Similarly, a clock of the function module (function B) 5 is supplied to the AND circuit 17 via the signal 5*b* having the value "0" of the register 5*a*, and no clock is supplied. Further, the value "0" of the register 14*a* is coupled to the regulator 14 via the signal 14*b*, and the operation state is obtained. The value "0" of the register 15*a* is coupled to the regulator 15 via the signal 15*b*, and the operation state is obtained. That is, although the low-speed clock is supplied from the clock 19, the operation mode becomes the high-speed operation mode in which the current supply capability is the maximum.

Next, trimming data stored in the nonvolatile memory 3 is read and the internal function is trimmed (S3).

Execution of a program code is started, and the CPU 2 executes the program code held in the memory 3 (S4). At this time point, the low-speed clock is supplied from the clock 19, and the operation mode is the high-speed operation mode.

After that, the operation mode shifts from the high-speed operation mode to the low-speed operation mode (S5). Specifically, by using the CPU 2, "1" is written in the registers 14*a* and 15*a*. By the operation, the step-down regulator 14 for intermediate speed and the step-down regulator 15 for high speed are stopped, and the operation mode shifts to the low-power-consumption mode.

Subsequently, arithmetic operation 1 is executed (S6). In the arithmetic operation 1, arithmetic process is performed at low speed synchronously with a low-speed clock supplied from the clock 19.

After that, the operation mode shifts from the low-speed operation mode to the high-speed operation mode (S7). Specifically, by using the CPU 2, "0" is written in the registers 14*a* and 15*a*, and the operation of the step-down regulator 14 for intermediate speed and the step-down regulator 15 for high speed is restarted. It cancels the low-power-consumption mode. This step relates to preparation for executing high-speed arithmetic operation.

Then, clock setting 1 is performed (S8). The registers 6*a*, 7*a*, and 9*a* are set, the path of the external oscillator 26, the oscillator 6, and the PLL 7 is activated and, further, an output without frequency division is selected by the selector 9.

Next, clock setting 2 is performed (S9). Specifically, the PLL 7 is selected by the selector 8 so that the path of the external oscillator 26 is selected for supplying a clock signal to the clock 19, and a high-speed clock is supplied.

Next, arithmetic operation 2 is executed (S10). In the arithmetic operation 2, arithmetic process is performed at high speed synchronously with a high-speed clock. Since the operation mode is preliminarily changed to the high-speed operation mode in step S7, current supply from the regulators 13, 14, and 15 is sufficiently large.

Then, clock setting 3 is performed (S11). "0", that is, the frequency divider 12 (¼ frequency division) is selected by the selector 9, and the clock 19 is set to ¼ frequency division of the PLL 7. A clock supplied to the clock 19 is changed to the intermediate-speed clock.

Next, the operation mode is switched from the high-speed operation mode to the intermediate-speed operation mode (S12). That is, "0" is written in the register 14*a* and "1" is written in the register 15*a* by the CPU 2.

After that, arithmetic operation 3 is executed (S13). In the arithmetic operation 3, arithmetic process is performed at intermediate speed synchronously with the intermediate-speed clock supplied from the clock 19.

Then, clock setting 4 is performed (S14). The internal oscillator 10 is selected by the selector 8. The state of the internal oscillator 10 and the selector 9 is not changed. That is, the clock 19 is changed to the low-speed clock which is supplied via the path from the internal oscillator 10 to the frequency divider 12 (¼ frequency division).

After that, the operation mode is switched from the intermediate-speed operation mode to the low-speed operation mode (S15). Specifically, "1" is written in the registers 14*a* and 15*a* by the CPU 2 and not only the step-down regulator 15 for high speed but also the step-down regulator 14 for intermediate speed are stopped. By the operation, the operation mode further shifts to the low-power-consumption mode.

The semiconductor integrated circuit 1 enters the standby state (S16) which is a state of waiting for an external interrupt or the like.

The trimming of the internal functions in step S3 is to adjust reference voltage, current source, or the like of the regulators 13 to 15, the internal analog circuits, and the like by data (trimming value) held in the nonvolatile memory. As this is a general function, its detailed description will not be given here.

As described above, setting of the frequency (high speed/intermediate speed/low speed clocks) of clock signals supplied from the clock 19 and adjustment of the current supply capability and fixed current controlled by operating/stopping the regulators 13 to 15 are properly set/changed by a program executed by the CPU 2. For example, to perform the arithmetic operation 2 at high speed in step S10, prior to it, the clock 19 is changed to high-speed clock, and the operation mode has to be changed to the high-speed operation mode. For example, to suppress the consumption power to the minimum in the standby state in step S16, prior to it, the clock 19 is changed to the low-speed clock, and the operation mode has to be changed to the low-speed operation mode. Consequently, each of the steps (S5, S7, S12, and S15) for setting the registers to properly change the operation mode is necessary in correspondence with each of the steps of changing the frequency of the clock 19 (S8, S9, S11, and S14).

In this method, since the state of the internal clock has to be always properly grasped, exception processes such as plural interruptions and interrupts which occur multiply and the like have to be always grasped, and there is a problem that usability is poor. Although the three modes are used in the examination example, in the case such that the larger number of modes are provided to control the power more finely, the usability is poorer.

The further details will be described.

In the above-described example, the clock frequencies are three types of high/intermediate/low, the operation modes are similarly three types of high speed/intermediate speed/low speed, and the clocks correspond to the operation modes in a one-to-one manner such that the high-speed operation mode is suitable for the high-speed clock, the intermediate-speed operation mode is suitable for the intermediate-speed clock, and the low-speed operation mode is suitable for the low-speed clock. However, since the clock frequency is arbitrarily given by the external oscillator 26, in reality, a proper operation mode made correspond on the basis of a concrete operation frequency (absolute value). Although the examination example has been described on assumption of one system that the clock signal is from only the clock 19, in reality, in many cases, a plurality of clock systems are mounted and the frequency of each of the clocks is variable. The corresponding relation between a combination of the frequencies of the clocks and a proper operation mode in such cases is complicated.

There is also a problem of the order of settings. In the examination example in which the operation modes are described as the current supply capabilities of the regulators, in the high-speed operation mode, there is no functional problem when the operation is performed at a clock of any of high speed, intermediate speed, and low speed. There is only a problem that fixed current is consumed excessively only for the amount the number of regulators is not minimum in the cases of intermediate speed and the low speed. On the other hand, when the intermediate-speed or high-speed clock is supplied in the low-speed operation mode and the arithmetic process or the like is executed, a functional failure may occur due to shortage of supply of the consumption current. Therefore, in the case of changing the clock from the low speed to the high speed, prior to the change of the clock, the operation mode has to be changed to the high-speed operation mode. On the contrary, in the case of changing the clock from the high speed to the low speed, the operation mode has to be changed after changing the clock. Consequently, programming has to be made properly so that, as just described, in the case of changing the clock frequency, the operation mode is changed before or after the clock change in accordance with the change which is the change to the high frequency or the change to the low frequency.

As described above, at the time of changing the clock frequency, it is insufficient to set the frequency which is suitable for a process to be executed. It is necessary to grasp that the clock setting change is in the direction of increasing the clock frequency or the direction of lowering the clock frequency, or that the change is unnecessary. Similarly, it is insufficient to simply change the operation mode to an operation mode according to a process to be executed. It is necessary to properly determine whether the operation mode is changed before or after the clock setting change, or a change of the operation mode is unnecessary. In programming, it is easy to properly grasp the clock frequency and the operation mode suitable to a process to be executed because they are specifications which are determined according to a process and are static. On the other hand, it is not easy to grasp the clock frequency and the operation mode at the time point of performing a setting change for the purpose because the clock frequency and the operation mode at the time of performing a setting change may dynamically change due to a plurality of interruptions, multiple interruptions, or the like. Consequently, separate solving means is necessary such that a global variable holding the clock frequency and the operation mode is prepared, is read and checked prior to a setting change, and a process step of determining the setting change is necessary or not and changing the order is added during the program. It causes poor usability.

First Embodiment

FIG. 1 is a block diagram illustrating a configuration example of the semiconductor integrated circuit 1 of a first embodiment. In a manner similar to the above-described examination example, a microcomputer will be described as an example. The semiconductor integrated circuit 1 of the first embodiment includes the same components as those of the semiconductor integrated circuit 1 of the examination example illustrated in FIG. 14 except for the registers 14*a* and 15*a* and further includes a register 30 and a table circuit 31. The registers 4*a* to 9*a* mounted in the semiconductor integrated circuit 1 of the examination example will be called a first register group, and the register 30 added in the first embodiment will be called a second register. The second register 30 is a register to/from which data can be written/read by the CPU 2 like the registers 4*a* to 9*a*. Data held in the registers 4*a* to 9*a* is supplied as the control signals 4*b* to 9*b* to the circuits in the semiconductor integrated circuit 1 in a manner similar to the examination example and also input as data 4*c* to 9*c* to the table circuit 31. The data held in the second register 30 is also input as data 30*a* to the table circuit 31. An output PCNT[1:0] 32 from the table circuit 31 is a control signal of two bits. The lower bit (PCNT[0]) side is supplied to the step-down regulator 14 for intermediate speed, and the higher bit (PCNT[1]) side is supplied to the step-down regulator 15 for high speed The step-down regulator 14 for intermediate speed operates when the lower bit (PCNT[0]) of the output signal 32 is "0", and stops when the lower bit (PCNT[0]) is "1". Similarly, the step-down regulator 15 for high speed operates when the upper bit (PCNT[1]) of the output signal 32 is "0" and stops when the upper bit (PCNT[1]) is "1". Since the other configuration is similar to that of the above-described examination example, it will not be described.

In the first register group, a parameter indicating the relative relation between the frequency of the clock source supplied from the oscillator 6 or the internal oscillator 10 and the frequency of the internal clock is held. Concretely, examples of the parameter indicating the relative relation include the parameters 4*b* and 5*b* controlling supply/stop of clocks to the function modules 4 and 5, the parameter 6*b* controlling oscillation/stop of the oscillator 6, the parameter 7*b* indicating the multiplication number of the PLL 7, the parameter 8*b* controlling the selector 8, and the parameter 9*b* as a selection signal of the selector 9 selecting whether frequency division by the frequency dividers 11 and 12 is performed or not. On the other hand, in the second register 30, information indicating the absolute value of the frequency of the clock source is held. As the oscillation frequency of the internal oscillator 10 is fixed in the first embodiment, the frequency or the frequency range of the clock source determined by the oscillator 26 which is coupled on the outside is held. From the information of the absolute value of the clock frequency of the clock source stored in the first register 30 and the parameter indicating the relative relation stored in the second register group, the absolute value of the frequency of the internal clock 19 can be calculated. However, it is unnecessary to explicitly calculate the absolute value of the frequency. The "relative relation" may include not only a proportional relation such as the multiplication number or frequency division ratio but also a selective relation of selecting the oscillator 6 or the internal oscillator 10 and a control relation to stop supply of the clock 19 to the function modules 4 and 5.

The table circuit 31 outputs control information associated to the information indicative of the relative relation between the frequency of the clock source and the frequency of the internal clock 19 input from the first register group and the information indicative of the absolute value of the frequency of the clock source input from the second register 30 to the output PCNT[1:0] 32. The table circuit 31 can be mounted by, for example, a memory to which the data 4*c* to 9*c* and 30*a* is input as addresses and from which the output PCNT[1:0] 32 can be read as data. In this case, the memory may be a nonvolatile memory or a rewritable volatile memory such as a RAM (Random Access Memory). The memory may be a storage circuit mounted as a logic circuit such as a flip flop or a logic circuit such as an arithmetic circuit or a control circuit. Further, it can be realized by a combination of an arithmetic circuit, a control circuit, and a memory.

Figure 2:
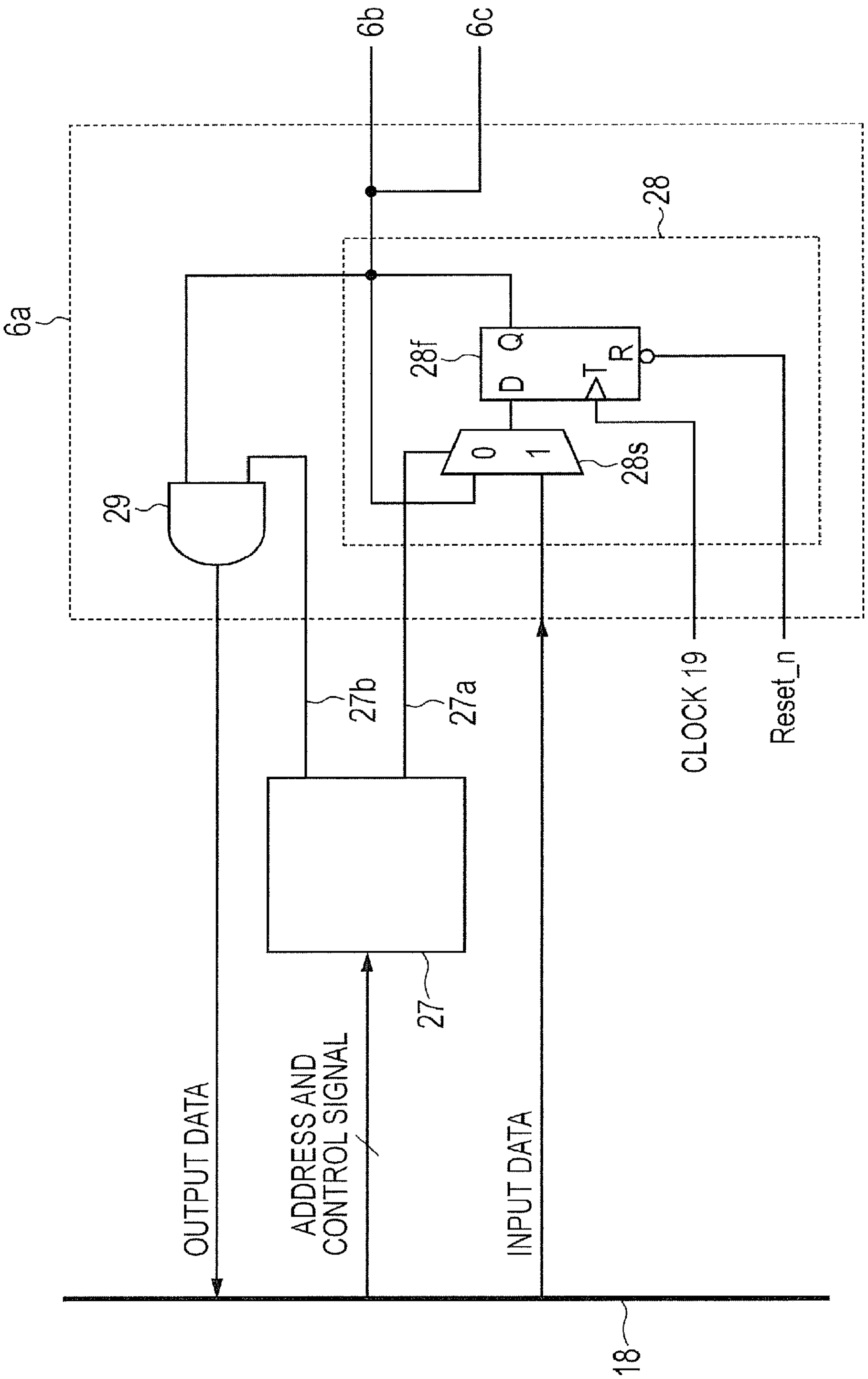
FIG. 2 is a circuit diagram illustrating a configuration example of a register.

FIG. 2 is a circuit diagram illustrating a configuration example of a register, which can be commonly applied to the registers 4*a* to 9*a* and 30*a*. FIG. 2 illustrates the circuits of the register 6*a* as an example. For easier understanding, only one bit is illustrated.

Illustrated in the diagram are a decoder 27, a storage 28 comprised of a selector 28*s* and a flip flop 28*f*, and a bus drive circuit 29 which is an AND circuit illustrated as an example. To a clock terminal (TR) and a reset terminal (which is reset at "0") in the flip flop 28*f*, the clock 19 and a reset signal Reset_n input from the reset terminal 21 are coupled, respectively. An address and a write control signal supplied via the bus 18 are decoded by the decoder 27 to generate a register write signal 27*a* which is input to the storage 38 and controls the selector 38*s*. At the time of register writing, that is, when the signal 27*a* is "1", input data supplied from the bus 18 is written into the flip flop 28*f* via the selector 28*s*. When the signal 27*a* is "0", the selector 28*s* is coupled to a data output Q of the flip flop 28*f*, and the write value is held. On the other hand, the address and the read control signal supplied via the bus 18 are decoded by the decoder 27 to generate a register read signal 27*b*. At the time of register reading, that is, when the signal 27*b* is "1", an output of the storage 28 is read as output data to the bus 18 via the AND circuit 29 as a bus drive circuit. The data in the storage 28 is input as 6*b* and 6*c* to the oscillator 6 and the table circuit 31 of the semiconductor integrated circuit 1 illustrated in FIG. 1.

Figure 3:
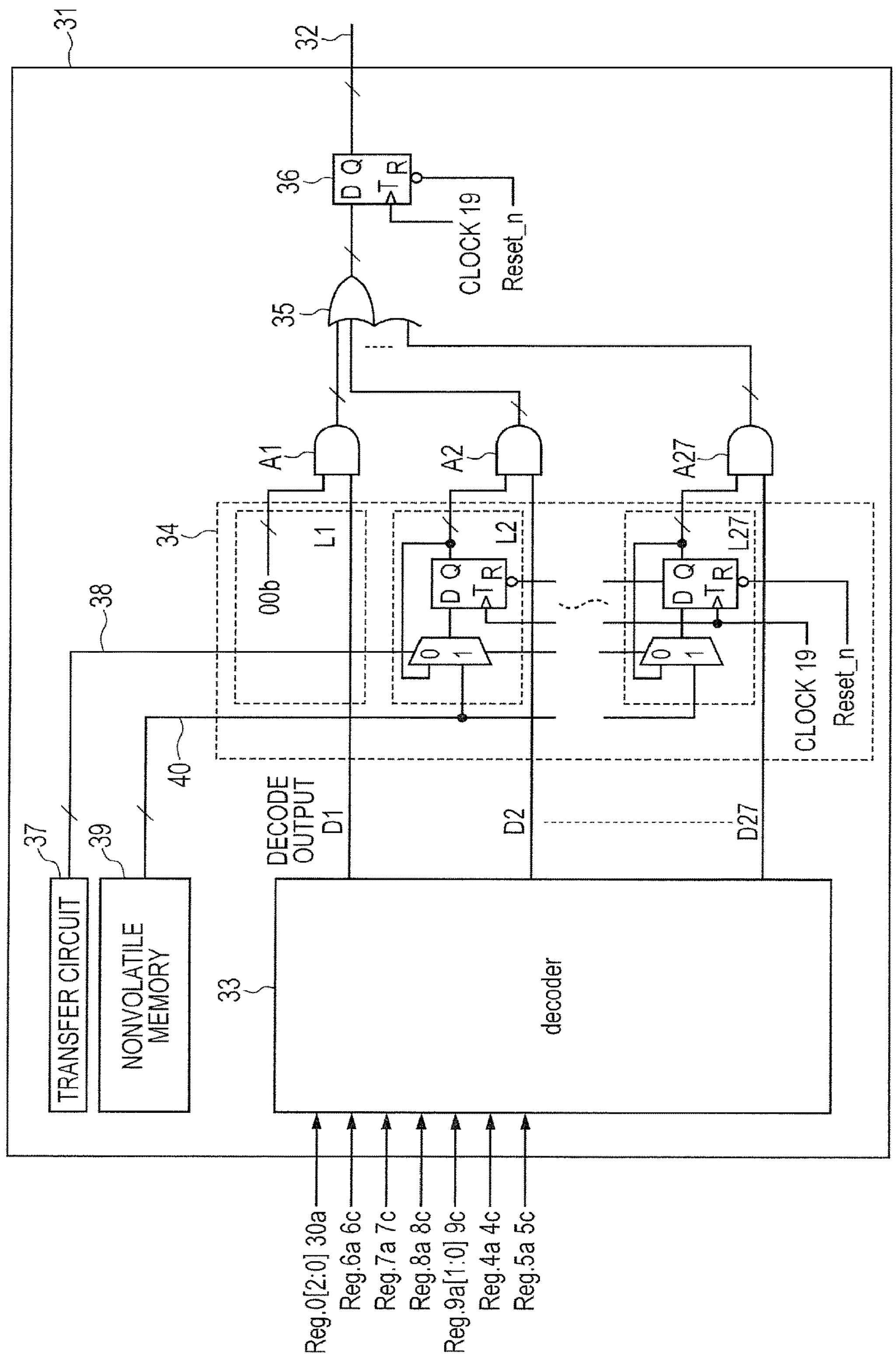
FIG. 3 is a circuit block diagram illustrating a configuration example of a table circuit.

FIG. 3 is a circuit block diagram illustrating a configuration example of the table circuit 31. 33 denotes a decode circuit, 34 denotes a reference table, A1 to A27 indicate AND circuits, 35 indicates an OR circuit, 36 denotes a flip flop, 37 denotes a transfer circuit, 38 denotes a write signal, 39 denotes a nonvolatile memory, and 40 denotes reference data. The reference table 34 has registers L1 to L27 each of two bits and each comprised of a selector and a flip flop. A register storing "00b" like the register L1 illustrated in FIG. 3 may be configured so as to output fixed "00b" by a line selected by a decode output without providing a selector and a flip flop. To the flip flop of each of the other registers L2 to L27, the clock 19 and the reset Reset_n are coupled.

The data signals 4*c* to 9*c* from the first register group and the data signal 30*a* from the second register 30 are input to the decode circuit 33. The decode circuit 33 decodes the input signals and asserts the signals by setting one of the decode outputs D1 to D27 to "true" ("1"). In the AND circuits A1 to A27, a fixed signal indicated by L1 as a component of the reference table 34 or data of a plurality of bits held in the registers L2 to L27 each made by the selector and the flip flop is selected, and the control signal 32 is output synchronously with the clock from the flip flop circuit 36 via the OR circuit 35. In the table circuit 31, the reference table 34 is controlled by the write signal 38 generated by the transfer circuit 37, and the reference data 40 read from the nonvolatile memory 39 is written and held in the registers L2 to L27 in the reference table 34. Transfer of the reference data 40 is performed, for example, at the time of power on.

FIG. 4 is a truth table illustrating an example of functions of the table circuit 31. The truth table is configured by a combination of a truth table on the left side in which decode inputs indicating the function of the decode circuit 33 and decode outputs are associated, and a truth table on the right side in which the decode outputs and the outputs 32 from the table circuit 31 are associated.

The first register group of 6*a* to 9*a* is set according to a clock (clock 19) required by the user, and the register group of 4*a* and 5*a* is set when the user uses the function modules (functions A and B) 4 and 5.

As a parameter set in the second register 30, a parameter defined in advance by the manufacturer of the semiconductor integrated circuit 1 is set by a program by the user. Specifically, the parameter is a parameter indicating the frequency of the oscillator 26, which is not specified at the manufacture stage of the semiconductor integrated circuit 1 but is determined at the stage the user uses the function modules. The manufacturer defines parameters as described below and the user sets the parameters by a program.

- In the case of use at 4 MHz<oscillator≤5 MHz, "0" is set in the register 30 [1:0].
- In the case of use at 5 MHz<oscillator≤6 MHz, "1" is set in the register 30 [1:0].
- In the case of use at 6 MHz<oscillator≤7 MHz, "2" is set in the register 30 [1:0].
- In the case of use at 7 MHz<oscillator≤8 MHz, "3" is set in the register 30 [1:0].

By the above, by the first register group of 4*a* to 9*a* and the parameter set in the second register 30, the frequency of the clock 19 can be calculated, and the frequency in the term of "state" in the truth table of FIG. 4 is obtained.

In the semiconductor integrated circuit 1, the operation mode can be set, for example, as follows in accordance with the frequency of the clock 19.

- When clock 19≤2 MHz, the low-speed operation mode can be set.
- When 2 MHz<clock 19≤40 MHz, the intermediate-speed operation mode can be set.

When 40 MHz<clock 19, only the high-speed operation mode is set.

At this time, the value of the reference table 34 can be determined by the manufacturer of the semiconductor integrated circuit 1 for each of calculation values of the frequency of the clock 19 illustrated in the column of "state" and becomes the value illustrated in the column of "reference table 34" in the truth table of FIG. 4. To simplify description in FIG. 4, all of the values of 4*c* and 5*c* in FIG. 4 may be set to "0" or "1". In the embodiment, since the current supply capability of the regulator and the fixed current are adjusted by an operation mode, the control may be changed to a control which depends also on the values of the registers 4*a* and 5*a* controlling supply and stop of the clock 19 to the function modules 4 and 5. Consequently, the operation mode can be controlled more finely, and power consumption can be reduced. For example, in the case where the clock stops when the data 4*c* and 5*c* of the registers 4*a* and 5*a* is "0", the current supply capability required for the regulators 13 to 15 may be smaller than that in the case where the clock is supplied when the data 4*c* and 5*c* is "1". Therefore, the operation can be allowed in the operation mode on the low speed side which is up to the relatively high clock frequency.

The operation of the semiconductor integrated circuit 1 of the first embodiment will be described.

Figure 5:
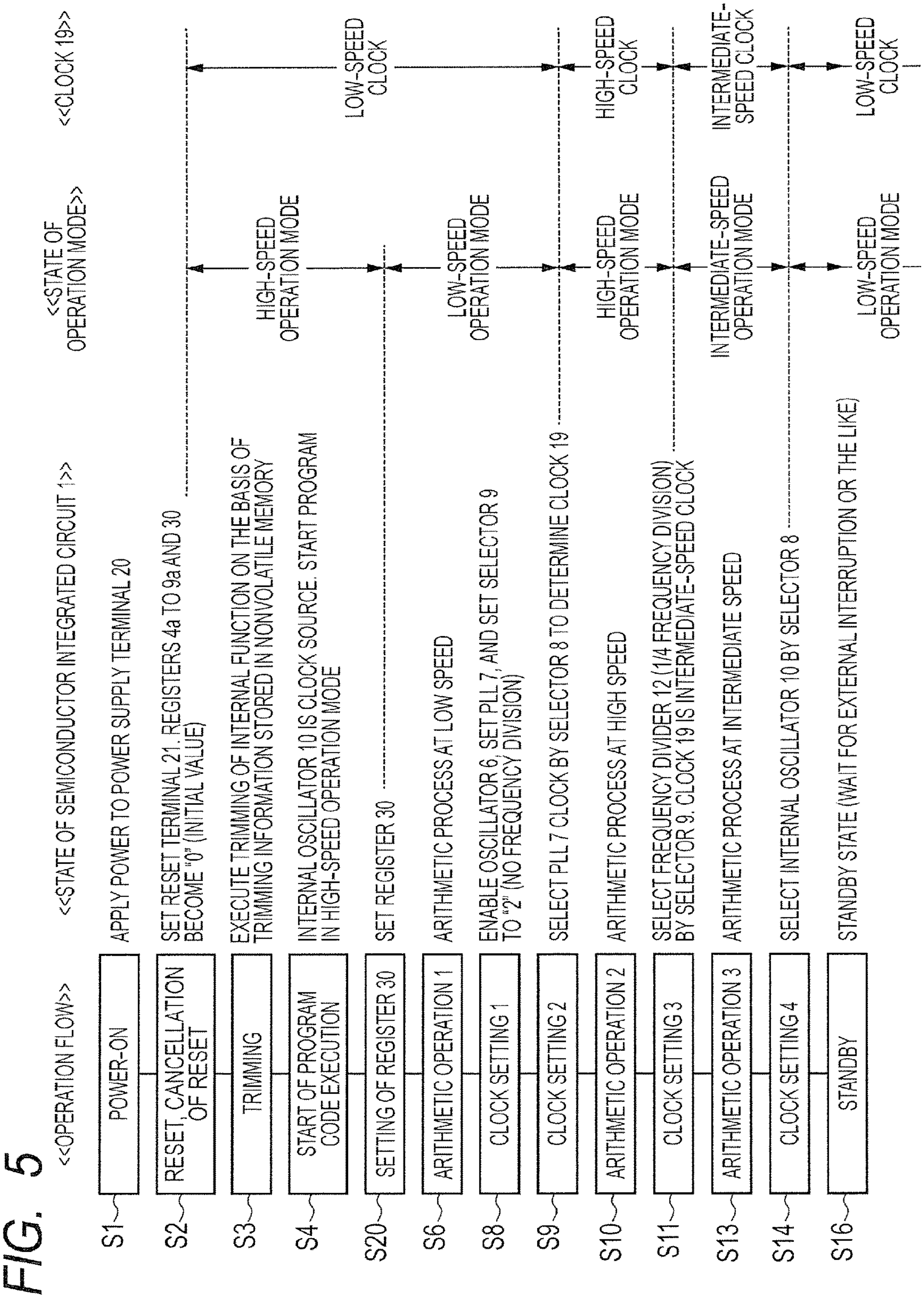
FIG. 5 is a flowchart illustrating an operation example of the semiconductor integrated circuit of the first embodiment.

FIG. 5 is a flowchart illustrating an operation example of the semiconductor integrated circuit 1. Like the examination example, it relates to an example in the case where the semiconductor integrated circuit 1 has the following three operation modes in accordance with the current supply capabilities of the regulators 13 to 15, and shifts among the operation modes. In the high-speed operation mode, high-speed arithmetic operation in which all of the regulators 13, 14, and 15 operate and a path without frequency division of the PLL 7 and the selector 9 is used can be executed. In the intermediate-speed operation mode, intermediate-speed arithmetic operation in which the step-down regulator 15 for high speed stops, the step-down regulator 14 for intermediate speed and the step-down regulator 13 for low speed operate, and the path of ¼ frequency division of the PLL 7 and the selector 9 is used can be executed. In the low-speed operation mode, low-speed arithmetic operation in which the step-down regulator 14 for intermediate speed and the step-down regulator 15 for high speed stop, only the step-down regulator 13 for low speed operates, and the internal oscillator 10 is used is executed, or the standby state may be set.

The operation flow of FIG. 5 illustrates the operation of low-power-consumption control in the case of performing, first, low-speed arithmetic operation using the internal oscillator 10, next, performing intermediate-speed arithmetic operation using the path of ¼ frequency division of the PLL 7 and the selector 9 and, finally, shifting to the standby state using the internal oscillator 10. The processes such as the arithmetic operation executed are the same as those in the examination example illustrated in FIG. 15.

The operation flow will be described. The same step numbers are designated to the same steps as those in FIG. 15.

In the power-on step (S1), power is applied to the power supply terminal 20.

In the reset/reset cancellation step (S2), when a reset signal is asserted from the reset terminal 21 and, after that, cancelled, the semiconductor integrated circuit 1 starts operating. In the reset, all of the registers 4*a* to 9*a* and 30 are initialized to "0". Specifically, as the clock 19, the internal oscillator (1 MHz) 10 is selected by the selector 8, and a clock supplied via the frequency divider 12 (¼ frequency division) is selected by the selector 9. That is, the clock 19 becomes 0.25 MHz. On the other hand, in the table circuit 31, as illustrated in FIG. 4, the signal 30*a* is initialized to "0", so that decoding in the decode No. 1 illustrated in the table is performed. Specifically, a decode output signal D1 becomes true, and the table circuit 31 outputs "00b" as the signal 32 controlling the step-down regulator via the AND circuit A1, the OR circuit 35, and the flip flop 36. Therefore, both of the step-down regulators 14 and 15 are in the operating state, that is, the operation mode is the high-speed operation mode in which the current supply capability is the maximum.

Subsequently, in a manner similar to the examination example, trimming data stored in the nonvolatile memory 3 is read and the internal functions are trimmed (S3). Preferably, the transfer circuit 37 properly controls the control signal 38 at the trimming timing and reference data is written from the nonvolatile memory 39 to the reference table 34 indicated by the registers L2 to L27 via the data bus 40. In the reference table 34, the data indicated in the column of "reference table 34" in FIG. 4 is stored as reference data.

Next, execution of a program code is started, and the CPU 2 executes a program code held in the memory 3 (S4). At this time point, a low-speed clock is supplied from the clock 19, and the operation mode is the high-speed operation mode.

By executing the program code held in the memory 3 by the CPU 2, a parameter is set in the register 30 (S20). As the parameter, according to the frequency of the oscillator 26 coupled to the semiconductor integrated circuit 1, a proper value from "0" to "3" is set as illustrated in the "30*a* [1:0]" column in FIG. 4. It is now assumed that an oscillator of 6 MHz is used, that is, "1" is set in [1:0] of the register 30. After that, 30*a*[2] is set to "1". By the settings, according to the state of the first register (all of them are "0"), "11*b*" in the reference table 34 written in the decode No. 2 in FIG. 3 is output as the output 32, that is PCNT[1:0], the step-down regulators 14 and 15 stop, and the operation mode shifts to the low-speed operation mode.

After that, the arithmetic operation 1 is executed (S6). The arithmetic operation 1 is performed at low speed synchronously with the low-speed clock supplied from the clock 19.

Subsequently, clock setting 1 is performed (S8). The registers 6*a*, 7*a*, and 9*a* are set, the path of the external oscillator 26, the oscillator 6, and the PLL 7 is activated, and further, an output without frequency division is selected by the selector 9.

Next, clock setting 2 is performed (S9). That is, by selecting the PLL 7 by the selector 8, with the clock 19, the path of the external oscillator 26 is selected. Accompanying it, in the decode No. 15 in FIG. 4, the reference table value "00b" is output as the output 32, that is, PCNT[1:0], the step-down regulators 14 and 15 operate, and the operation mode shifts to the high-speed operation mode.

After that, the arithmetic operation 2 is executed (S10). The arithmetic operation 2 is performed at high speed synchronously with the high-speed clock. Since the operation mode is preliminarily changed to the high-speed operation in step S9, the current supply from the regulators 13, 14, and 15 is sufficiently large.

Subsequently, clock setting 3 is performed (S11). By selecting "0" by the selector 9, that is, selecting the frequency divider 12 (¼ frequency division), the clock 19 is divided to ¼ of the PLL 7. The clock supplied to the clock 19 is changed to the intermediate-speed clock. In accompany with it, in the decode No. 13 in FIG. 4, the reference table value "10*b*" is output to 32, the step-down regulator 14 operates, the step-down regulator 15 stops, and the operation mode shifts to the intermediate-speed operation mode.

After that, the arithmetic operation 3 is executed (S13). The arithmetic operation 3 is performed at intermediate speed synchronously with the intermediate-speed clock supplied from the clock 19.

Subsequently, clock setting 4 is performed (S14). By selecting the internal oscillator 10 by the selector 8, that is, the clock 19 is sent via the path of the internal oscillator 10 and the frequency divider 12 (¼ frequency division). In accompany with it, in the decode No. 2 in FIG. 4, the reference table value "11*b*" is output to 32, both of the step-down regulators 14 and 15 stop, and the operation mode shifts to the low-speed operation mode.

After that, the semiconductor integrated circuit 1 enters the standby state (S16). It is a state of waiting for an external interrupt or the like.

As described above, in step S3 of transferring trimming data, an operation of transferring reference data stored in the table circuit 31 is added, and the step S20 of setting the parameter according to the frequency of the oscillator 26 coupled to the semiconductor integrated circuit 1 is added to the operation flow illustrated in FIG. 15. On the other hand, the operation mode is automatically changed by the table circuit 31 in association with the register setting in each of the steps (S8, S9, S11, and S14) of performing the clock setting, so that each of the steps (S5, S7, S12, and S15) for the register setting to change the operation mode becomes unnecessary for the operation flow illustrated in FIG. 15. As described above, in the program steps, the steps S5, S7, S12, and S15 in which the operation mode is switched become unnecessary by addition of the step S20.

In reality, at the time of changing the clock setting, the determination of whether the frequency is to be increased or decreased by checking the clock setting at that time point and whether the operation mode setting is executed before or after the clock setting in association with it becomes necessary. In a very simple program which does not include a multiple interruption and the like, the change procedure can be programmed without a determination. However, in the operation in which a plurality of interruptions and multiple interruptions are allowed, it is difficult or impossible to forecast the operation mode changing procedure. Consequently, the number of steps which are reduced by the embodiment is larger.

As described above, without mounting a large-scale circuit such as a frequency measurement circuit or a frequency determination circuit, the burden on the program for changing the operation mode of the internal circuit in accordance with the internal clock frequency can be reduced. That is, the setting of the operation mode which is conventionally performed by the user becomes unnecessary, so that the easy-to-use semiconductor integrated circuit can be provided. Although the number of operation modes is conventionally suppressed in consideration of inconvenience of the setting for the user, in the embodiment, by providing a plurality of modes, the power can be controlled more finely.

Although the mode of controlling the current supply capabilities of the step-down regulators 13 to 15 and the fixed current has been described as the operation mode in the embodiment, a circuit other than the step-down regulators may be used. For example, in the low-speed operation mode, by decreasing bias current of a sense amplifier of a memory, power consumption is lowered while decreasing read speed. On the other hand, in the high-speed operation mode, by increasing the bias current of the sense amplifier, the read speed is increased. Further, although a wait cycle is included in memory reading in the low-speed operation mode, a control of excluding the wait cycle in the high-speed operation mode may be performed. A control object according to the operation mode may be not only the internal circuit such as the step-down regulator or the memory but also an external circuit such as a regulator circuit which is coupled on the outside. That is, an object to be controlled according to the operation mode may be an arbitrary circuit.

Although the example that, in the table circuit 31 in FIG. 3, data is read from the nonvolatile memory 39 and stored into the registers L2 to L27 in the reference table 34 has been described, fixed values may be stored in the registers L2 to L27 like in the register L1.

Although the example of externally providing the oscillator 26 as illustrated in FIG. 1 has been described, in place of it, a clock supplied from the outside may be used.

In the first register group, as described above, it is sufficient that a register holding a parameter indicating the relative relation between the frequency of the clock source and the frequency of the internal clock 19 is included, and other registers, for example, arbitrary registers of internal circuits such as a register monitoring the potential of the power supply terminal 20 and a register storing the temperature value of an internal temperature sensor may be further included. At this time, a parameter which is not the parameter indicating the relative relation of frequencies but a parameter which exerts an influence on the operation mode such as the operation voltage and the temperature can be set as an input of the table circuit 31, and the output 32 controlling the operation mode can be automatically changed according to the operation voltage and the temperature.

Although the embodiment has been described by using the microcomputer as an example, the kind of the semiconductor integrated circuit is not limited to the microcomputer but may be any kind as long as the circuit has a register coupled via a bus for interface to the outside such as a single A/D converter, a memory, or the like.

The above various modification examples described as supplement can be similarly applied to the other embodiments which will be described hereinafter.

Second Embodiment

Figure 6:
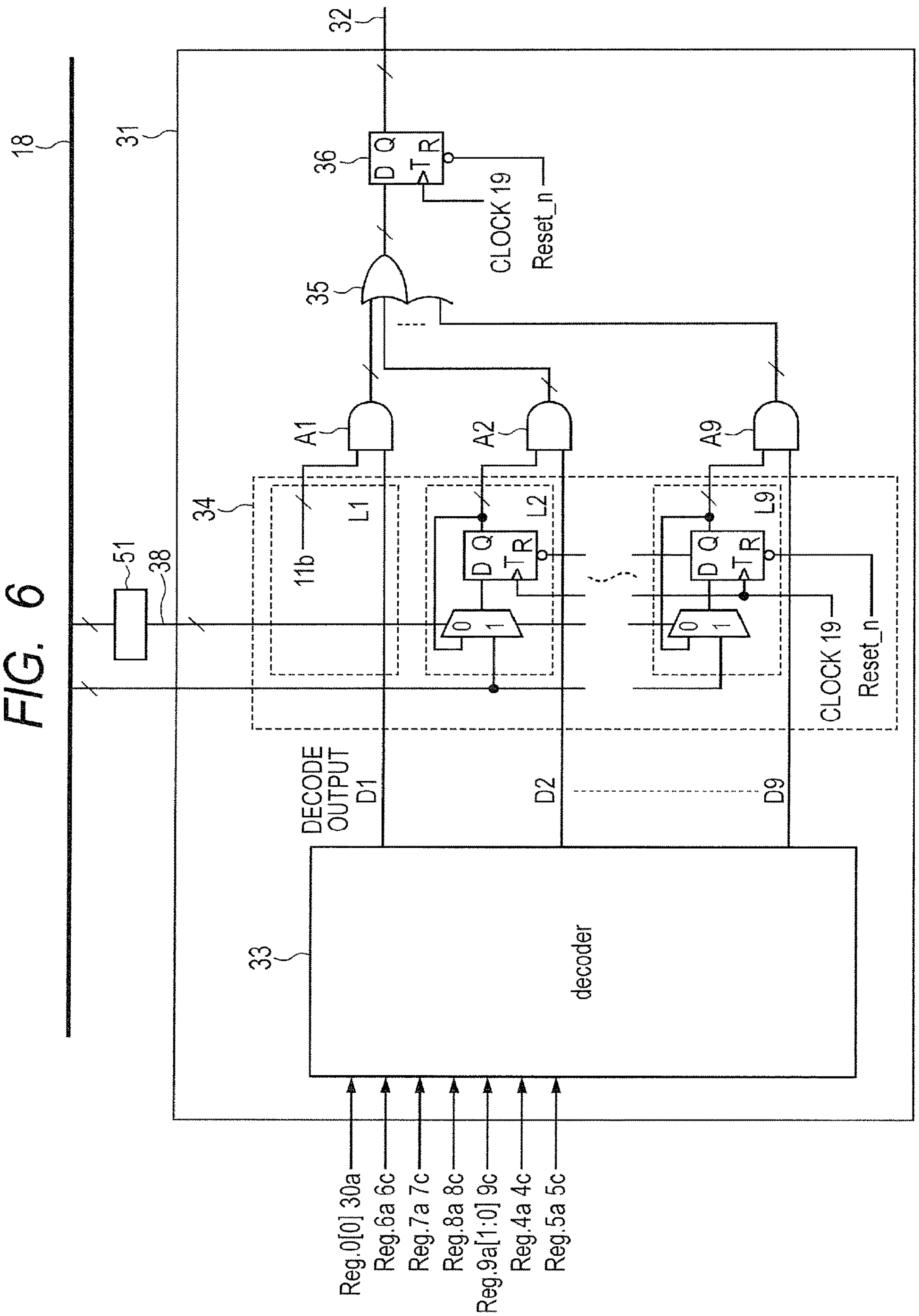
FIG. 6 is a circuit block diagram illustrating a configuration example of a second embodiment of a table circuit.

In a second embodiment, a configuration example different from that of FIGS. 3 and 4 of the table circuit 31 will be described. FIG. 6 is a circuit block diagram illustrating a configuration example of the second embodiment of the table circuit 31, and FIG. 7 is a truth table illustrating an example of functions of the table circuit 31.

The difference between the table circuit 31 of FIGS. 6 and 7 and the table circuit of FIGS. 3 and 4 is as follows.

- The input signal 30*a* of the register 30 in FIG. 1 input to the decode circuit 33 has a 1-bit width.
- The decode outputs are D1 to D9.
- The register circuits are L2 to L9.
- The AND circuits are A1 to A9.
- The write signal 38 of the registers L2 to L9 is generated via the bus 18.
- The write data of the registers L2 to L9 is coupled to the bus 18.
- The truth table of FIG. 7 illustrates the decode Nos. 1 to 9.

The other configuration and operation are similar to those of FIGS. 3 and 4. In the second embodiment, the truth table stored in the table circuit 31 is generated according to the frequency of the oscillator 26 used. Therefore, as illustrated in FIG. 7, the truth table is comprised of the decode outputs of only the case where the frequency of the clock source is a predetermined value. For example, FIG. 7 illustrates the case where the frequency of the oscillator 26 is 6 MHz. With the configuration, the scale of the truth table, that is, the circuit scale of the table circuit 31 is largely reduced. The truth table of FIG. 4 includes the decode Nos. 1 to 27 whereas that of FIG. 7 has the decode Nos. 1 to 9. In association with it, the table circuit 31 illustrated in FIG. 6 is comprised of the decode circuit 33 outputting the decode outputs D1 to D9, the registers L1 to L9, and the AND circuits A1 to A9, and its circuit scale is largely reduced from the scale of the circuit illustrated in FIG. 3. Also with respect to the register 30, information indicating the frequency of the oscillator is not stored, and input to the table circuit 31 is unnecessary.

The operation will be described with reference to FIG. 5 cited in the first embodiment and FIGS. 6 and 7.

Although the reference table covering the frequencies of oscillators which may be used by the user is prepared in the first embodiment, in the second embodiment, a data table 64 corresponding to a truth table of only in the case where the frequency of the oscillator 26 is a specific frequency is written from the bus 18 to the reference table 34. The data table 64 is generated, for example, by the manufacturer of the semiconductor integrated circuit 1 by using a reference table generation program 63 provided as a utility program for the program generator as the user.

Figure 8:
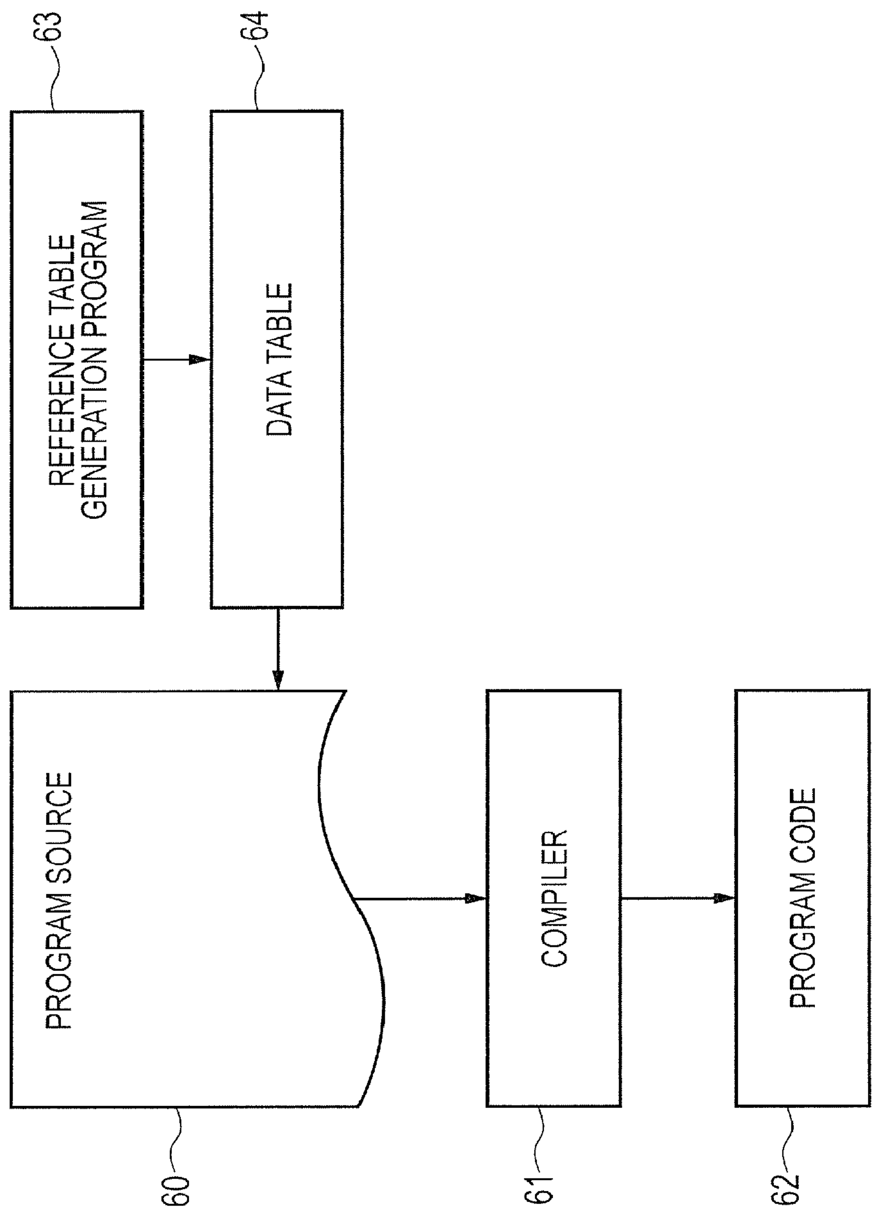
FIG. 8 is a flowchart illustrating a procedure of generating a program code executed in the semiconductor integrated circuit.

FIG. 8 is a flowchart illustrating a procedure of generating a program code 62 executed in the semiconductor integrated circuit 1. The program generator as the user compiles a program source 60 by a compiler 61 to generate the program code 62. At this time, the user inputs the frequency of an oscillator used in the semiconductor integrated circuit 1 when the program source 60 is executed into the reference table generation program 63. The table generation program 63 generates the data table 64 corresponding to the input frequency. The data table 64 is assembled and compiled in the program source 60, and the program code 62 includes an instruction code group for writing the data in the data table 64 into the registers L2 to L9 of the reference table 34 in the table circuit 31.

As described above, the data in the data table 64 corresponding to the frequency of the oscillator 26 actually used by the user is included in the program code 62 of the user. In the operation flow of the second embodiment, before the register 30 setting step S20 in the operation flow of the first embodiment illustrated in FIG. 5, a step of reading data in the data table 64 included in a program code from the memory 3 by the CPU 2 and writing it into the reference table 34 via the bus 18 is included. At the time of writing data to the reference table 34, the registers L2 to L9 in the reference table 34 are selected by a decoder 51 by an address of the bus 18, and the data of the bus 18 is written into each of the registers, thereby storing the data in the data table 64 into the reference table 34. When "1" is written into the register 30, the output 32 of the table circuit 31 is generated according to the decode illustrated in the truth table of FIG. 7.

The subsequent operation flow in the second embodiment is similar to that of the first embodiment illustrated in FIG. 5. The detailed description of the subsequent operation flow will not be given.

The reference table generation program 63 may be a utility program of taking a frequency to be used from all of frequencies prepared as illustrated in the truth table of FIG. 4, or a program of calculating the frequency of the clock 19 from a table equivalent to the truth table configured by the frequency to be used and the data of the first register group and generating data of the data table 64.

As described above, in the first embodiment, the reference table covering oscillators which may be used by the user is prepared, so that the scale of the reference table is large. It causes increase in the circuit scale and also a problem that the cost rises and current consumed by the table circuit 31 is large. Further, in the case of using the oscillator 26 which is provided externally as illustrated in FIG. 1, the frequency of an oscillator which can be coupled is limited to a range of a certain degree by the performance of the oscillator 6. In the case of allowing an external clock input, the range of frequencies which can be input is generally wider. There is a problem that a reference table of a larger scale becomes necessary in order to correspond to the wider range.

In contrast to them, in the second embodiment, it is sufficient to use a reference table of a specific clock frequency which is narrowed from the oscillator to be used or the external input clock frequency at the time of generating the program code of the user, so that the problem can be solved.

On the other hand, in the first embodiment, by providing the reference table covering the frequencies which may be used by the user, it is unnecessary to put burden on the program of the user. The first embodiment can easily cope with also the case of dynamically changing the frequency of an external clock. That is, it is sufficient to change the data in the register 30 in accordance with the frequency of the external clock.

The second embodiment can also cope with the case where the frequency of the external clock is dynamically changed. At a stage of compiling in a user program, all of clock frequencies used must be specified in routines and tasks configuring the user program. The data table 64 corresponding to all of the clock frequencies is generated by the table generation program 63 and embedded in the program code 62. When the frequency of the external clock is dynamically changed, the register 30 is once set to "0", that is, the reference table of the fixed value "00b" is activated. After that, the data table 64 corresponding to the clock frequency is written in the reference table 34.

As described above, the second embodiment can also cope with the case where the frequency of the external clock is dynamically changed, and easy-to-use power control can be realized.

Third Embodiment

Figure 9:
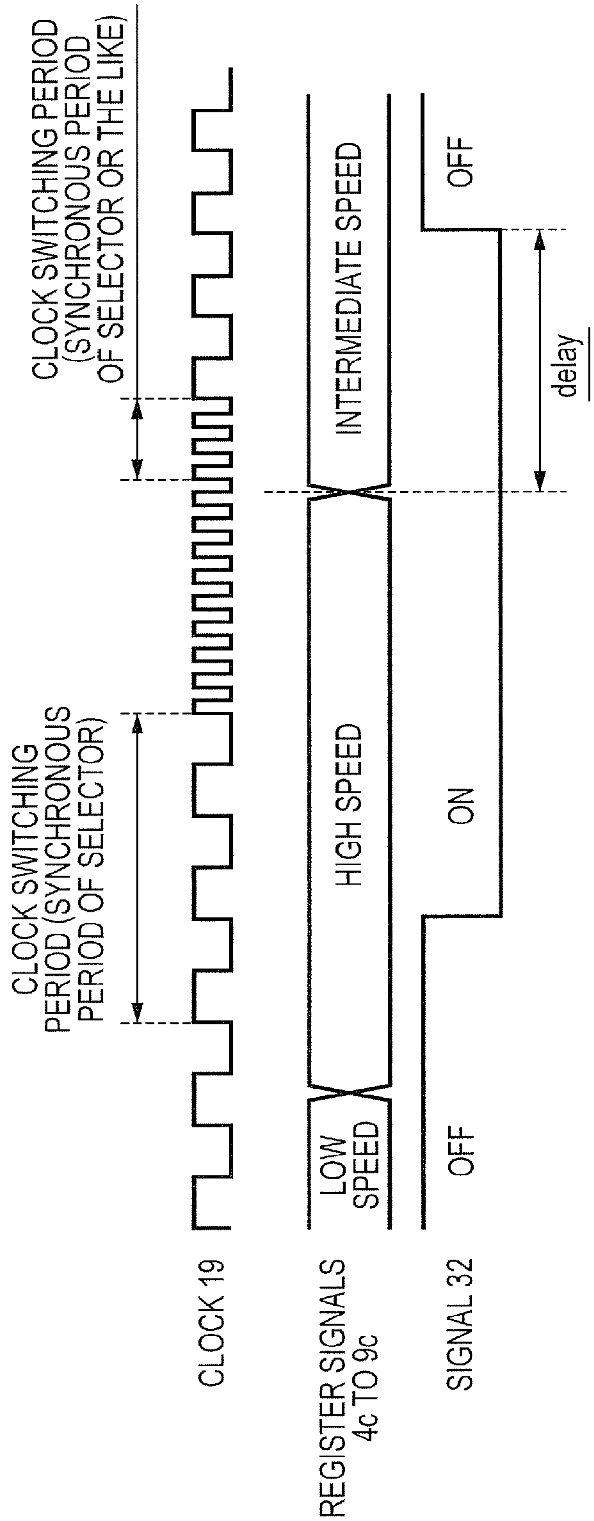
FIG. 9 is a waveform chart illustrating an operation example of a circuit controlling delay of a control signal, which is provided at a stage after the table circuit.
Figure 10:
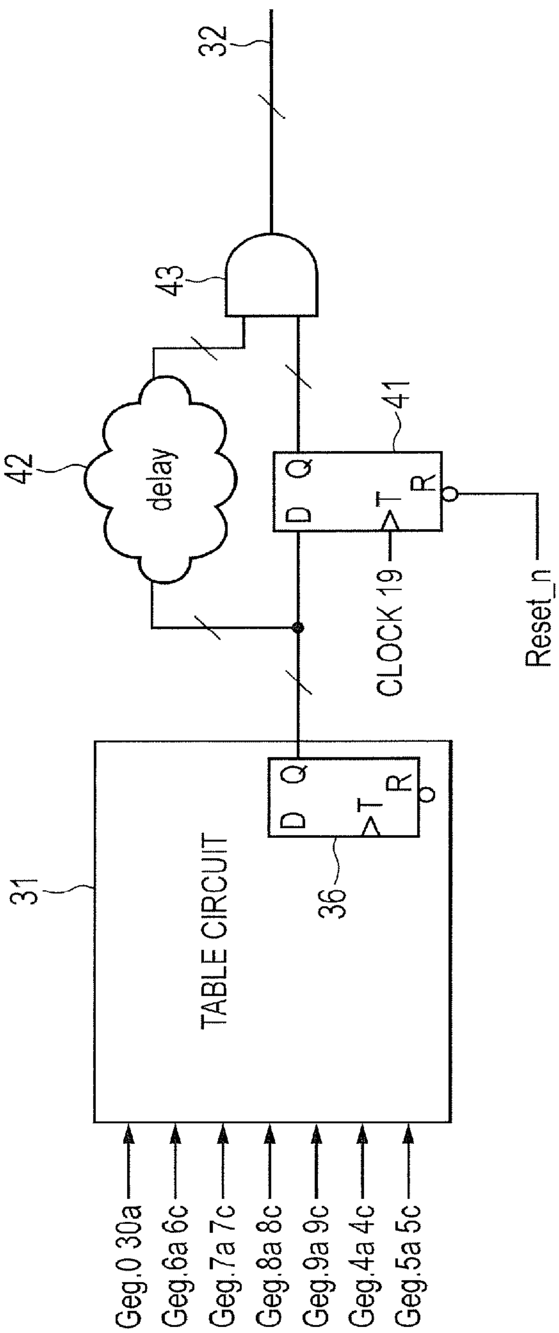
FIG. 10 is a circuit diagram illustrating a configuration example of the circuit controlling delay of a control signal, which is provided at the stage after the table circuit.

In a third embodiment, a circuit of controlling delay of the control signal 32, which is preferably provided on the stage after the table circuit 31 will be described. FIG. 9 is a waveform chart illustrating an operation example of the circuit. FIG. 10 is a circuit diagram illustrating a configuration example of the circuit. Since the basic configuration and operation are similar to those of the first and second embodiments, only characteristic operation in the third embodiment will be described.

FIG. 9 illustrates the waveform in the case of switching the clock 19 by the registers 4*a* to 9*a* (signal names 4*c* to 9*c*). Although detailed description will not be given, generally, a common circuit is such that, at the time of clock switching, a clock before the switching and a clock after the switching are synchronized not to cause glitch in the clock 19. In FIG. 9, the frequency of the clock 19 is switched after three clocks from the change in the register signals 4*c* to 9*c*. This is an example that the period for synchronization of the clock before the switching and the clock after the switching is set to three clocks. In the example, in the case of switching the clock 19 from low speed to high speed, a clock switching period of three cycles is taken at a low-speed clock. In the case of switching the clock 19 from high speed to intermediate speed, a clock switching period of three cycles is taken at a high-speed clock.

FIG. 10 illustrates circuits inserted between the table circuit 31 and its output 32 of the first and second embodiments, which are a flip flop 41 that is initialized ("0") by the clock 19 and the Reset_n signal supplied from the reset terminal 21, a delay circuit 42 causing a predetermined delay, and an AND circuit 43. An output of the flip flop 36 in the table circuit 31 is input to the flip flop 41 and the delay circuit 42, and logical AND is obtained from an output of the flip flop 41 and an output of the delay circuit 42 by the AND circuit 43 to generate the control signal 32.

In the circuit, the signal "0" (step-down regulator operation) generated by the flip flop 36 is fetched by the flip flop 41 at the rising edge of the subsequent clock 19 and "0" is output as the signal 32 via the AND circuit 43. On the other hand, the signal "1" (stop of the step-down regulator) generated by the flip flop 36 is subjected to a delay of the delay circuit 42 and "1" is output as the signal 32 via the AND circuit 43. That is, before the clock is switched to the high-speed clock, the step-down regulator starts operating and, after the clock is switched to the low-speed clock, the step-down regulator stops.

By the above operation, for example, at the time of switching the low-speed clock to the high-speed clock, the step-down regulator is activated early to prepare increase the power consumption at the time of shift to the high-speed clock. At the time of switching the high-speed clock to the low-speed clock, the step-down regulator is stopped slowly. That is, at the time of performing clock switching of increasing the clock frequency, the step-down regulator can always operate in advance. At the time of performing clock switching of lowering the clock frequency, after the power consumption becomes stable, the step-down regulator is stopped, so that the step-down regulator can be controlled to be capable of supplying stable power also at the time of a change in the power consumption.

The delay circuit 42 may be comprised of an analog element or a digital element. By configuring the delay circuit 42 by flip flops of proper number of stages, a proper delay value satisfying the above-described relation can be obtained more stably.

Fourth Embodiment

Figure 11:
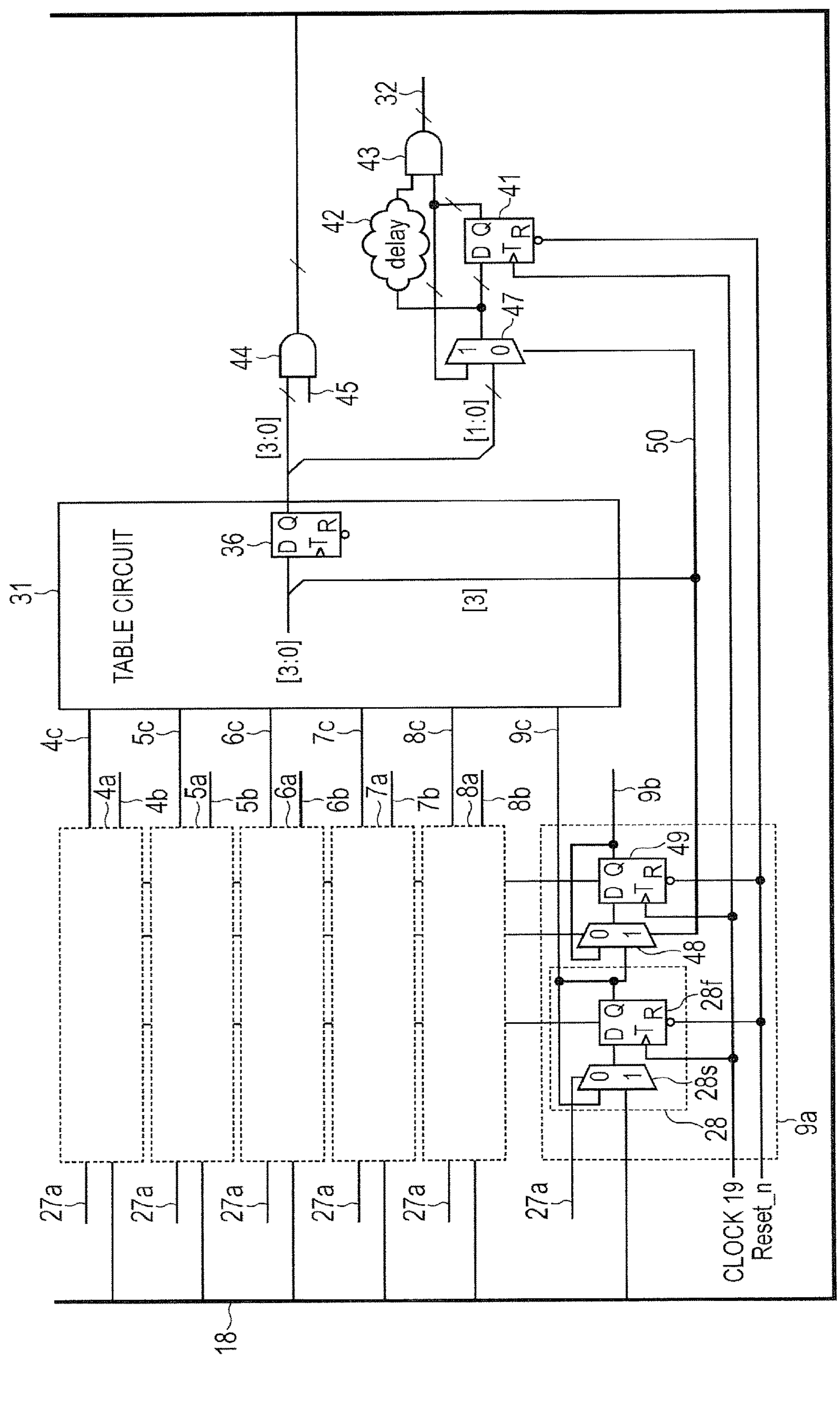
FIG. 11 is a block diagram illustrating a configuration example of the surroundings of registers and a table circuit in a semiconductor integrated circuit of a fourth embodiment.
Figure 12:
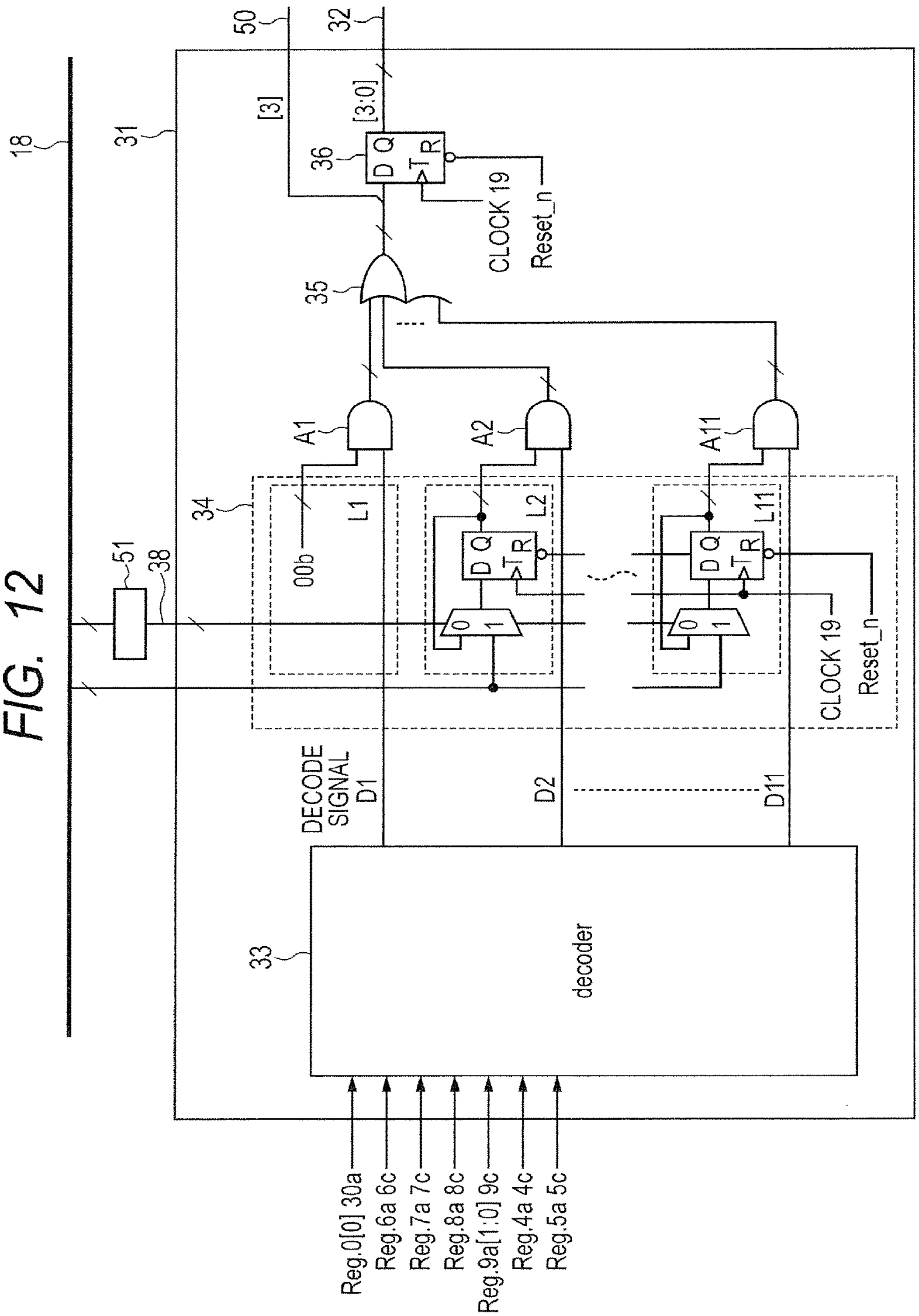
FIG. 12 is a circuit block diagram illustrating a configuration example of the table circuit of the fourth embodiment.

In a fourth embodiment, an example of adding a function of detecting a parameter setting which is inhibited to the table circuit 31 will be described. FIG. 11 is a block diagram illustrating a configuration example of the surroundings of the registers 4a to 9a and the table circuit 31 in the semiconductor integrated circuit 1 of the fourth embodiment. FIG. 12 is a circuit block diagram illustrating a configuration example of the table circuit 31. FIG. 13 is a truth table illustrating an example of functions of the table circuit 31.

Since the basic configuration and operation are similar to those of the first to third embodiments, only characteristic operation in the fourth embodiment will be described.

The registers 4a to 9a illustrated in FIG. 11 are a modification example of the register illustrated in FIG. 2. Specifically, a selector 48 and a flip flop 49 are added to the register of FIG. 2, and the outputs 4b to 9b control the oscillator 6, the PLL 7 and the like. The outputs 4c to 9c of the registers 4a to 9a are generated by the storage 28 comprised of the selector 28s and the flip flop 28f in a manner similar to FIG. 2 and input to the table circuit 31. In each of the registers 9a and the like, the decoder 27 and the read circuit 29 illustrated in FIG. 2 are not illustrated in FIG. 11.

To the output 32 of the table circuit 31, two bits are added in addition to PCNT[1:0] of the first and second embodiments. As illustrated in the truth table of FIG. 13, an output of the reference table 34 is made of four bits, and the highest bit [3] of the output of the OR circuit 35 is output as a signal 50.

Change points from the truth tale of the table circuit 31 of the second embodiment illustrated in FIG. 7, in the truth table of FIG. 13 are as follows. First, the decode No. 5 of outputting the signal 50 is added. When an inhibited combination is set from combinations of settings (4c to 9c) of the registers 4a to 9a, "1" is output as the highest bit in the reference table 34. The inhibited combination may be expanded to a plurality of decode Nos. and expressed. Further, although D2=1 is output when [6c, 7c, 8c]=[*, *, 0] in the decode No. 2 in FIG. 7, in FIG. 13, D2=1 is output when [6c, 7c, 8c]=[0, 0, 0] in the decode No. 2 in FIG. 13, and the decode Nos. 3 and 4 are added. In the decode No. 3, when [6c, 7c, 8c]=[0, 1, 0], D3=1 is output. In the decode No. 4, D4=1 is output when [6c, 7c, 8c]=[1, 0, 0], the output of the reference table 34 is set to "0111b", PCNT[1:0] ="11b" which is the same as that in the case of normal D2=1 is output, and "1" is output to [2]. The decode Nos. are for detecting a combination which is not inhibited but is redundant.

The configuration of the table circuit 31 is similar to that of FIG. 6 except that the decode signals are expanded to D1 to D11, the registers are expanded to L2 to L11, and the AND circuits are expanded to A1 to A11, and the number of bits is increased from two bits to four bits in association with the enlargement of the truth table as described above. The bit [3] added to the reference table 34 indicates a setting inhibited in the first register group, the bit [2] is a bit of giving a warning of redundant setting, and the bit [1:0] has a configuration similar to that in the second embodiment (FIG. 7).

FIG. 11 will be described. The bit [3] of the output of the table circuit 31 is coupled as the signal 50 to the selectors 47 and 48. The output [3:0] of the table circuit 31 generated by the flip flop 36 is coupled to the bus 18 via the AND circuit 44 and can be read by the CPU 2 by asserting the decode signal 45. The lower bit [1:0] of the table circuit 31 generated by the flip flop 36 is coupled via the selector 47 to the output 32 through 41, 42, and 43 in a manner similar to the third embodiment.

With the circuit configuration, the values set in the registers 4a to 9a are input to the table circuit 31 via 4c to 9c, and corresponding reference table values illustrated in the truth table of FIG. 13 are output.

The signal 50 plays the role of, for example, detecting a state where a clock cannot be supplied because the setting inhibition is made in the decoder in FIG. 13, that is, the oscillator 6 is set to be stopped regardless of the fact that the oscillator path is selected by the PLL 7 and the selector 8 in the decode No. 5. When the signal 50 is "0", the selector 48 selects the output of the storage 28, the selector 47 selects the output of the flip flop 36, the outputs are supplied to the flip flop 41, and normal operation is performed.

On the other hand, when the signal 50 is "1", that is, when inhibition setting is detected, the output of the flip flop 49 is fed back to the selector 48. That is, 4*b* to 9*b* controlling the oscillator 6, the PLL 7, and the like hold values before the detection that the signal 50 becomes "1" (inhibition setting). Similarly, the output of the flip flop 41 is fed back to the input via the selector 47. Specifically, as the control signal 32, the value before it is detected that the signal 50 becomes "1", that is, the value before the inhibition setting is held. The state of the setting inhibition can be read by the CPU 2 via the AND circuit 44 selected by the decode signal 45.

Further, the bit 2 ([2]) of the AND circuit 44 is to give a warning of redundant setting. For example, in the decode No. 3 in FIG. 13, although the internal oscillator 10 is selected by the selector 8, the PLL 7 is operated. The bit 2 plays the role of giving a warning that power is consumed excessively only by the amount of the operation current of the PLL 7. Similarly, in the decode No. 4, the oscillator 6 operates although the internal oscillator 10 is selected by the selector 8, and the bit 2 plays the role of giving a warming that power is consumed excessively only by the amount of the operation current of the oscillator 6.

As described above, by reading the value of the flip flop 6 as an output of the reference table 34 via the AND circuit 44 after setting of the registers 4*a* to 9*a*, the inhibition setting and the state of the warning can be recognized.

Although the example of reading the inhibition setting and the warning by the CPU 2 via the AND circuit 44 has been described in the embodiment, it is also possible to couple the highest bit [3] of the flip flop output 36 indicating the inhibition setting and the bit [2] indicating of the warning as interrupt request signals to the interrupt control circuit, and perform an exception process.

According to the fourth embodiment, the semiconductor integrated circuit can be provided, in which time required to investigate and analyze an unintentional operation and power consumption caused by inhibition setting or undesirable setting conventionally occurring in the program development process, and which is more easily used by combination with the first to third embodiments.

Although the invention achieved by the inventors of the present invention has been concretely described on the basis of the embodiments, obviously, the present invention is not limited to the embodiments but can be variously changed without departing the gist.

What is claimed is:

1. A semiconductor integrated circuit comprising:

an internal clock generation circuit generating an internal clock signal from an outer clock signal;

a first register coupled to the internal clock generation circuit;

a table circuit coupled to the first register; and an internal circuit coupled to the internal clock generation circuit and having a plurality of operation modes, wherein the first register stores a first information specifying a relation between an internal clock signal and an outer clock signal, wherein the internal clock generation circuit generates the internal clock signal in response to the first information, and wherein the table circuit stores control information specifying a relation between a control signal for setting one of the operation modes and the first information, and outputs the control signal in response to the first information.

2. The semiconductor integrated circuit according to claim 1, wherein the table circuit has a decode circuit decoding the first information and outputting a decode result, and a storage circuit storing the control information so as to be associated with the decode result, and wherein the storage circuit outputs the control signal according to the decode result.

3. The semiconductor integrated circuit according to claim 1, further comprising a delay circuit coupled to the table circuit and giving a predetermined delay to the control signal.

4. The semiconductor integrated circuit according to claim 3, wherein the predetermined delay is set to a delay amount which shifts the control signal before a change in the case of changing a frequency of the internal clock so as to become high, and is set to a delay amount which shifts the control signal after a change in the case of changing the frequency of the internal clock so as to become low.

5. The semiconductor integrated circuit according to claim 2, wherein the decode result includes a first decode value indicating a state in which setting of the first information is inhibited, and the control information stored in the storage circuit includes first control information associated in the case where the decode result is the first decode value.

6. The semiconductor integrated circuit according to claim 5, wherein the decode result further includes a second decode value indicating a state where the first information is not recommended, and the control information stored in the storage circuit further includes second control information associated in the case where the decode result is the second decode value.

7. The semiconductor integrated circuit according to claim 1, wherein the internal circuit is a power supply circuit whose current supply capability is adjustable, the magnitude of the current supply capability is specified in correspondence with each of the plurality of operation modes, and the magnitude of the current supply capability is adjusted on the basis of the control signal.

8. The semiconductor integrated circuit according to claim 1, further comprising an oscillation circuit generating an outer clock signal according to an oscillator which is coupled.

* * * * *